(12) United States Patent
Chiu et al.

(10) Patent No.: US 12,310,029 B2
(45) Date of Patent: May 20, 2025

(54) SEMICONDUCTOR MEMORY DEVICE AND MANUFACTURING METHOD THEREOF

(71) Applicant: TAIWAN SEMICONDUCTOR MANUFACTURING COMPANY LTD., Hsinchu (TW)

(72) Inventors: Yu-Chien Chiu, Hsinchu (TW); Meng-Han Lin, Hsinchu (TW); Chun-Fu Cheng, Hsinchu County (TW); Han-Jong Chia, Hsinchu (TW); Chung-Wei Wu, Hsin-Chu County (TW); Zhiqiang Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 75 days.

(21) Appl. No.: 18/331,138

(22) Filed: Jun. 7, 2023

(65) Prior Publication Data
US 2023/0320102 A1    Oct. 5, 2023

Related U.S. Application Data

(62) Division of application No. 17/351,121, filed on Jun. 17, 2021, now Pat. No. 11,716,857.

(51) Int. Cl.
*H10B 51/20* (2023.01)
*H01L 29/06* (2006.01)
(Continued)

(52) U.S. Cl.
CPC ......... *H10B 51/20* (2023.02); *H01L 29/0649* (2013.01); *H10B 51/10* (2023.02); *H10B 51/30* (2023.02)

(58) Field of Classification Search
CPC ............ H01L 29/0642; H01L 29/0649; H01L 29/0653; H10B 51/10; H10B 51/20; H10B 51/30
See application file for complete search history.

(56) References Cited

U.S. PATENT DOCUMENTS

| 2019/0288192 A1* | 9/2019 | Takahashi | .......... H10N 70/8616 |
| 2020/0343307 A1* | 10/2020 | Lee | ......................... H10B 63/34 |

(Continued)

FOREIGN PATENT DOCUMENTS

| CN | 102034760 A | * | 4/2011 | ........ H01L 27/11551 |
| CN | 113421884 A | * | 9/2021 | ........ H01L 27/11582 |

*Primary Examiner* — Matthew E Warren
(74) *Attorney, Agent, or Firm* — WPAT LAW; Anthony King

(57) ABSTRACT

A semiconductor memory device includes a stack of alternating insulating layers and first conductive layers disposed over a substrate; a plurality of memory cell strings penetrating the stack over the substrate, each memory cell string comprising a central portion extending through the stack, a semiconductor layer surrounding the central portion, and a ferroelectric layer surrounding the semiconductor layer, and the central portion comprising a channel isolation structure and a second conductive layer and a third conductive layer at two sides of the channel isolation structure; and a plurality of cell isolation structures penetrating the conductive layers and the insulating layers over the substrate and disposed between two memory cell strings, each cell isolation structure comprising a top portion and a bottom portion adjoined to the top portion and different from the top portion.

20 Claims, 34 Drawing Sheets

(51) Int. Cl.
*H10B 51/10* (2023.01)
*H10B 51/30* (2023.01)

(56) References Cited

U.S. PATENT DOCUMENTS

2021/0375935 A1* 12/2021 Ling .................... H10B 51/10
2022/0231044 A1* 7/2022 Lee ..................... H10B 43/35
2023/0013725 A1* 1/2023 Watanabe ......... H01L 29/42324

* cited by examiner

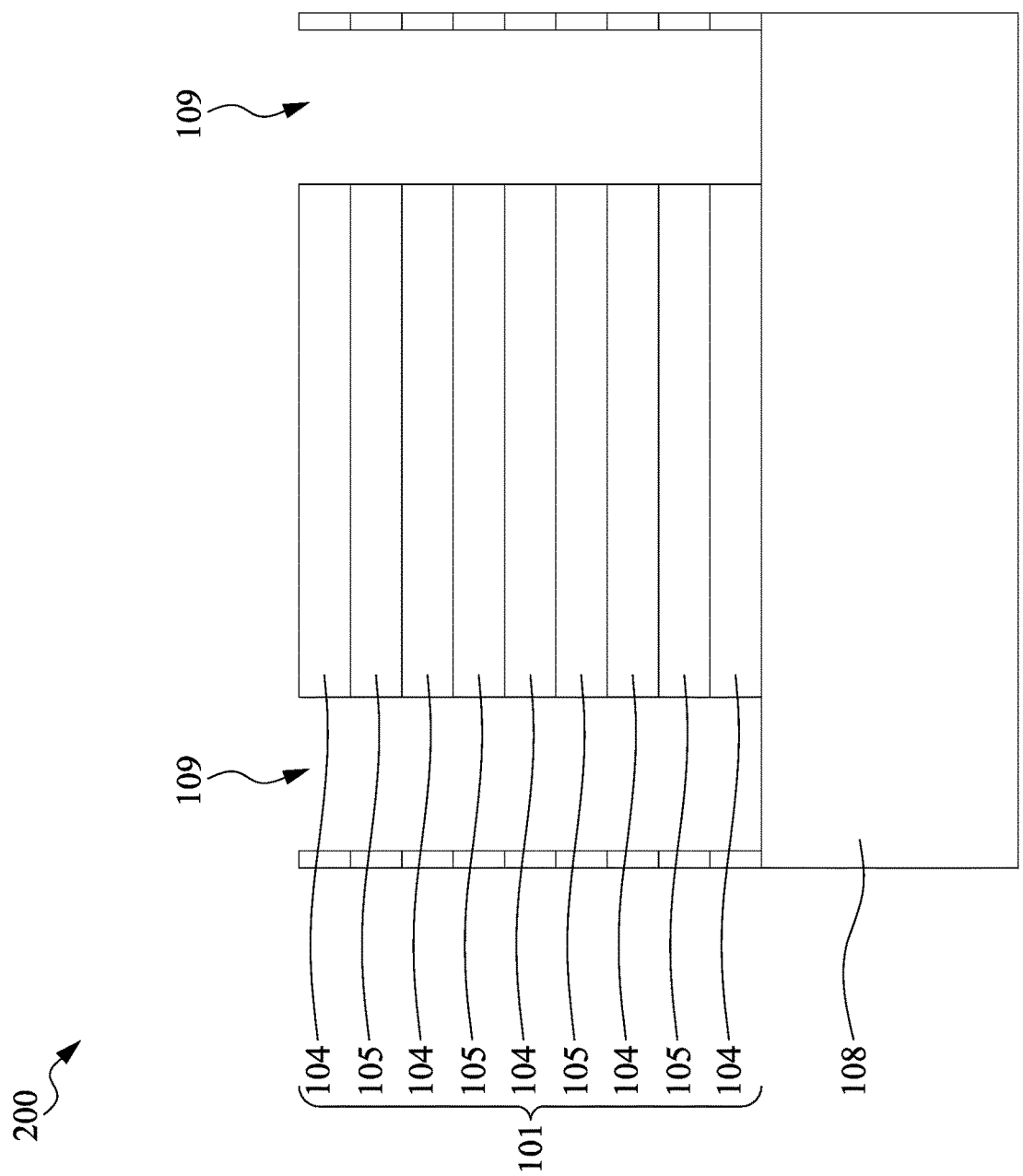

SEMICONDUCTOR MEMORY DEVICE AND MANUFACTURING METHOD THEREOF

PRIORITY CLAIM AND CROSS-REFERENCE

This application is a division of U.S. patent application Ser. No. 17/351,121, entitled "SEMICONDUCTOR MEMORY DEVICE AND MANUFACTURING METHOD THEREOF" filed on Jun. 17, 2021; the application is incorporated herein by reference in their entireties.

BACKGROUND

Many modern-day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

FIGS. 17B, 18B, 19B, 20B, and 21B are schematic cross-sectional views taken along line I-I' of FIGS. 17A, 18A, 19A, 20A, and 21A.

DETAILED DESCRIPTION OF THE DISCLOSURE

Figure 1:
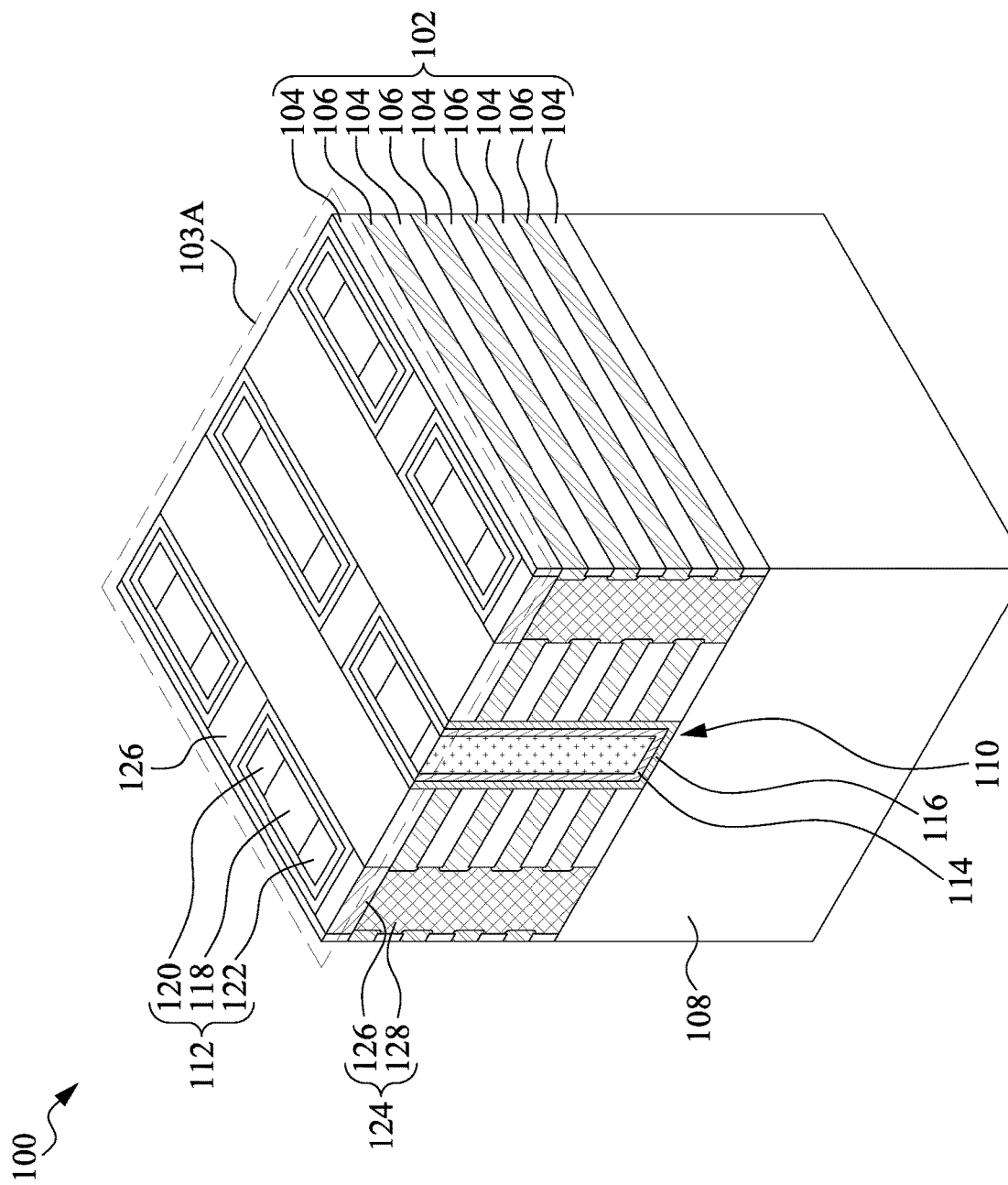
FIG. 1 is a schematic view illustrating a semiconductor memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

In the present disclosure, three-dimensional (3D) semiconductor memory devices, particularly stackable FeRAM devices, are provided. The 3D memory device stacks memory cells into multiple layers to create a vertical layout. The present disclosure relates to design of 3D ferroelectric non-volatile memory devices for increasing the storage density and improving the structural stability of the semiconductor memory device. Additionally, the structures and methods disclosed herein may be applied to other memories. Other features and processes may also be included.

High-density storage devices employing 3D memory stack structures have been proposed. For example, a 3D NAND stacked memory device can be formed from an array of a stack of alternating insulating materials and spacer material layers that are formed as conductive layers or replaced with conductive layers over a substrate containing peripheral devices (e.g., driver/logic circuits). Memory isolation trenches are formed through the stack, and are filled with memory stack structures, each of which includes a vertical stack of memory elements and a vertical semiconductor channel. The fabrication of 3D NAND flash memory becomes mature in the last decade because of having advantages such as better performance and speed, lower energy consumption, better endurance, and cost efficiency. A 3D NOR memory was seldom mentioned, probably due to its more complicated circuit and difficulties to have process splitting source lines and bit lines.

FeRAM has lower power consumption, the potential for better performance, does not depend upon complex refresh circuitry, and is non-volatile. As appreciated in some aspects of the present disclosure, however, during manufacture of the stacked FeRAM, an etching process can cause reliability concerns, particularly on strut/cell isolation first process. In some comparative approaches, in the strut/cell isolation first process, a portion or some height of the strut/cell isolation will be lost during the word line etch. This etch can cause consumed strut/cell isolation height and bombardment defects of the multiple oxide/nitride films, thereby resulting in collapse of the structure. It is difficult to control etching selectivity/profile between the strut/cell isolation and the oxide/nitride films. The loss of the strut/cell isolation height may adversely affect the stability, reliability, its foundation and surrounding area, leading to failure and/or inoperability of the FeRAM device.

Thus, the present disclosure relates to a 3D stackable FeRAM nonvolatile memory device, which uses a hard head on strut/cell isolation for protection during the word line etching process, so as to reduce height loss of strut/cell isolation. The hard head and corresponding manufacturing process help improve structural stability and reliability of FeRAM devices. A design of the 3D stackable semiconductor memory device is modified so that the loss of height/thickness of the strut/cell isolation can be prevented. In some embodiments, the provided 3D architectures can be applied to FeRAM and extendable to other memories such as flash, RRAM, MRAM with decent process and structure modifications. Accordingly, a stable type of 3D stackable nonvolatile memory devices can be formed, so that the device property can be enhanced.

FIG. 1 is a schematic view illustrating a semiconductor memory device 100 in accordance with some embodiments of the present disclosure. As shown in FIG. 1, the semiconductor memory device 100 includes a stack 102 of alternating insulating layers 104 and first conductive layers 106 disposed over a substrate 108. The stack 102 comprises a memory cell region 103A. The semiconductor memory device 100 also comprises a plurality of memory cell strings 110 in the memory cell region 103A penetrating the stack 102 over the substrate 108. In some embodiments, each memory cell string 110 comprises a central portion 112 extending through the stack 102, a semiconductor layer 114 surrounding the central portion 112, and a ferroelectric layer 116 surrounding the semiconductor layer 114. In some embodiments, the central portion 112 comprises a channel isolation structure 118, and a second conductive layer 120 and a third conductive layer 122 at two sides of the channel isolation structure 118. In some embodiments, the semiconductor memory device 100 further comprises a plurality of cell isolation structures 124 in the memory cell region 103A penetrating the stack 102 over the substrate 108. In some embodiments, each cell isolation structure 124 comprises a top portion 126 and a bottom portion 128 adjoined to the top portion 126 and different from the top portion 126. In some embodiments, each cell isolation structure 124 is disposed between two memory cell strings 110. In some embodiments, the stack 102 further comprises a connection region adjoined to the memory cell region 103A and configured in a staircase structure (not shown in FIG. 1).

In some embodiments, the substrate 108 provides support and serves as the foundation upon which integrated circuit devices are fabricated. The substrate 108 comprises silicon, silicon dioxide, aluminum oxide, sapphire, germanium, gallium arsenide (GaAs), an alloy of silicon and germanium, indium phosphide (InP), silicon on isolator, or any other suitable material. In some embodiments, the substrate 108 may have one or more layers of material, such as dielectric, conducting, or semiconducting material deposited thereon.

In some embodiments, the number of the alternating layers included in the stack 102 can be made as high as the number of layers needed for the 3D semiconductor memory device. In some embodiments, the stack 102 may include between 16 and 512 layers of alternating insulating and first conductive layers, whereby each insulating layer or first conductive layer constitutes one layer. In some embodiments, the insulating layers 104 in the stack 102 are the same or different materials and may include silicon oxide ($SiO_2$) layers. In some embodiments, the first conductive layers 106 in the stack 102 includes various conductive materials, e.g., metal such as aluminum (Al), titanium (Ti), cobalt (Co), silver (Ag), gold (Au), copper (Cu), nickel (Ni), chromium (Cr), hafnium (Hf), rhodium (Ru), tungsten (W), platinum (Pt) and/or alloys thereof, or a metal nitride such as titanium nitride (TiN), tantalum nitride (TaN), or the like, but is not limited thereto. In some embodiments, the first conductive layers 106 correspond to word lines of the semiconductor memory device 100. In some embodiments, the uppermost layer of the stack 102 is the insulating layer 104.

In some embodiments, the memory cell strings 110 are arranged in a configuration depending upon the design of the applications. In some embodiments, the memory cell strings 110 are arranged in an array configuration of rows and columns or in a staggered array configuration. In some embodiments, the number of the memory cell strings 110 can be made as high as the number of they needed. In some embodiments, the memory cell strings 110 perpendicularly penetrate through the stack 102 and extend to the substrate 108. In some embodiments, the memory cell strings 110 extend downwardly from the surface of the semiconductor memory device 100 and are perpendicular to the surface of the substrate 108. In some embodiments, each memory cell string 110 has a rectangular or square cross-sectional shape and can vary in size depending upon the applications.

In some embodiments, the channel isolation structures 118 of the memory cell strings 110 may comprise any suitable isolation material, such as an isolation oxide (e.g., $SiO_2$), and may be formed or deposited extending downwardly from the surface of the semiconductor memory device 100 and are perpendicular to the surface of the substrate 108 by any suitable fabrication process (e.g., implant, lithography). In some embodiments, the second conductive layer 120 and the third conductive layer 122 are independently formed in a column shape, e.g., flat column or rectangular column shape, extending in a vertical direction with respect to the substrate 108 and at two sides of the channel isolation structure 118. In some embodiments, the second conductive layer 120 corresponds to source lines and the third conductive layer 122 corresponds to bit lines. In some embodiments, the second conductive layer 120 corresponds to bit lines and the third conductive layer 122 corresponds to source lines. In some embodiments, the bit lines and the source lines can independently include various conductive materials, e.g., metal such as aluminum (Al), titanium (Ti), cobalt (Co), silver (Ag), gold (Au), copper (Cu), nickel (Ni), chromium (Cr), hafnium (Hf), rhodium (Ru), tungsten (W), platinum (Pt) and/or alloys thereof, or a metal nitride such as titanium nitride (TiN), tantalum nitride (TaN), or the like, but is not limited thereto.

In some embodiments, the semiconductor layers 114 surrounding the central portions 112 of the memory cell strings 110 may include a semiconductor material. In some embodiments, the semiconductor layers 114 include various materials, such as an amorphous silicon (a-Si) material, a polycrystalline silicon (poly-Si) material, an oxide semiconductor material (e.g., indium zinc oxide (IZO), indium-gallium-zinc oxide (IGZO), indium tungsten oxide (IWO), indium tin oxide (ITO), zinc oxide (ZnO), stannous oxide (SnO), and copper oxide (CuO)), or the like, but is not limited to the above-mentioned materials. In some embodiments, channel region is formed in the semiconductor layers 114.

In some embodiments, the ferroelectric layer 116 surrounding the semiconductor layer 114 is used as a part of gate dielectric of a transistor (not shown) to achieve non-volatility. In some embodiments, the ferroelectric layer 116 can be any suitable materials that are known in the art. For example, the ferroelectric layer can include $BaTiO_3$, $PbTiO_3$, $PbZrO_3$, $LiNbO_3$, $NaNbO_3$, $KNbO_3$, $KTaO_3$, $BiScO_3$, $BiFeO_3$, $Hf_{1-x}Er_xO$, $Hf_{1-x}La_xO$, $Hf_{1-x}Y_xO$, $Hf_{1-x}Gd_xO$, $Hf_{1-x}Al_xO$, $Hf_{1-x}Zr_xO$, $Hf_{1-x}Ti_xO$, $Hf_{1-x}Ta_xO$, AlScN, or the like (wherein $0<x<1$), but is not limited to the above-mentioned materials, but the disclosure is not limited thereto. In some embodiments, other suitable layers, such as an interfacial layer, e.g., $SiO_2$, SiON, or $Al_2O_3$, can be formed in combination with the ferroelectric layer 116. In some embodiments, any suitable dielectric of function layers can be formed in the memory cell strings 110.

In some embodiments, the cell isolation structure 124 is disposed between two adjacent memory cell strings 110 to isolate unit cells 132 (see FIG. 2) in the memory cell strings 110. In some embodiments, the cell isolation structures 124 and the memory cell strings 110 can be alternately arranged along a column direction in the array configuration or the staggered array configuration. In some embodiments, the cell isolation structures 124 are arranged in an array configuration or a staggered array configuration. In some embodiments, the cell isolation structures 124 perpendicularly penetrate through the stack 102 and extend to the substrate 108. In some embodiments, the cell isolation structures 124 extend downwardly from the surface of the semiconductor memory device 100 and are perpendicular to the surface of the substrate 108. In some embodiments, each cell isolation structure 124 comprises a top portion 126 and a bottom portion 128 adjoined to the top portion 126 and different from the top portion 126. In some embodiments, the top portions 126 of the cell isolation structures 124 have an etch selectivity ratio different from that of the bottom portions 128 of the cell isolation structures 124 or the insulating layers 104. In some embodiments, the etching rates of the top and bottom portions 126 and 128 both have etch selectivity ratio different from that of the insulating layers 104. In some embodiments, the top portions 126 of the cell isolation structures 124 have a hardness higher than the bottom portions 128 of the cell isolation structures 124 or the insulating layers 104. In some embodiments, the bottom portions 128 are formed of a first material and the top portions 126 are formed of a second material. In some embodiments, the first material may include a first isolation dielectric, such as silicon oxide and silicon nitride, but is not limited to the above-mentioned materials. In some embodiments, the second material may include a second isolation dielectric that is different from the first isolation dielectric. In some embodiments, the second material can include SiCN, $Al_2O_3$ or other isolation dielectrics, such as $HfO_2$, SiON, and $La_2O_3$, but is not limited to the above-mentioned materials. In some embodiments, a height of the top portion 126 and a height of the cell isolation structure 124 are in a ratio ranging from about 1:1 to about 1:100, about 1:1 to about 1:50, about 1:1 to about 1:30, about 1:1 to about 1:20, about 1:1 to about 1:10, or about 1:1 to about 1:5, but is not limited to the above-mentioned ratios.

Figure 2:
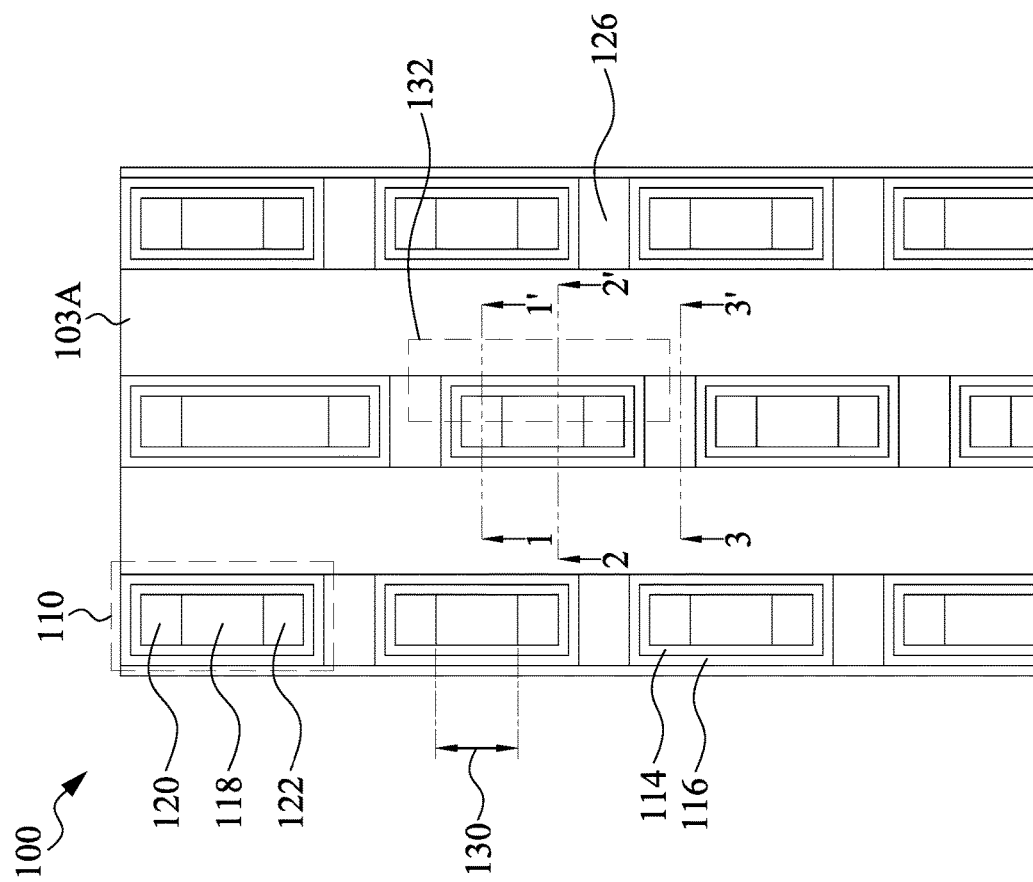
FIG. 2 is a schematic top view of the semiconductor memory device of FIG. 1.

FIG. 2 is a schematic top view of the semiconductor memory device 100 of FIG. 1. As shown in FIG. 2, the semiconductor memory device 100 comprises a plurality of memory cell strings 110 arranged in a staggered array configuration in the memory cell region 103A. In some embodiments, each memory cell string 110 comprises a plurality of unit cells 132. In some embodiments, a channel region 130 with source and drain regions (not shown) is formed in the semiconductor layer 114 in each unit cell 132. In some embodiments, the channel region 130 is disposed between the source and drain regions (not shown). In some embodiments, the source and drain regions (not shown) are respectively coupled to the source and bit lines 120 and 122.

Figure 3:
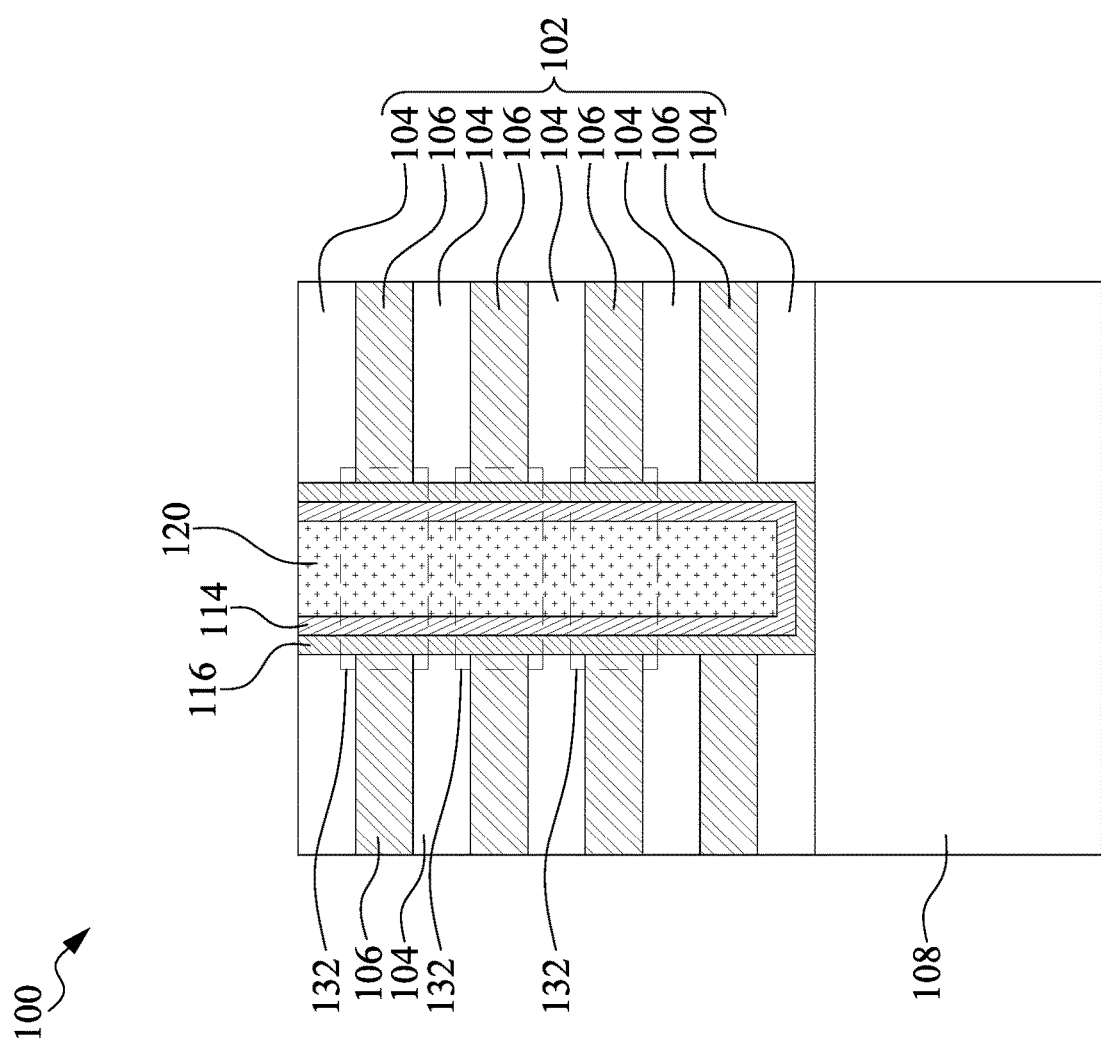
FIG. 3 is a cross-sectional view taken along line 1-1' of FIG. 2.
Figure 4:
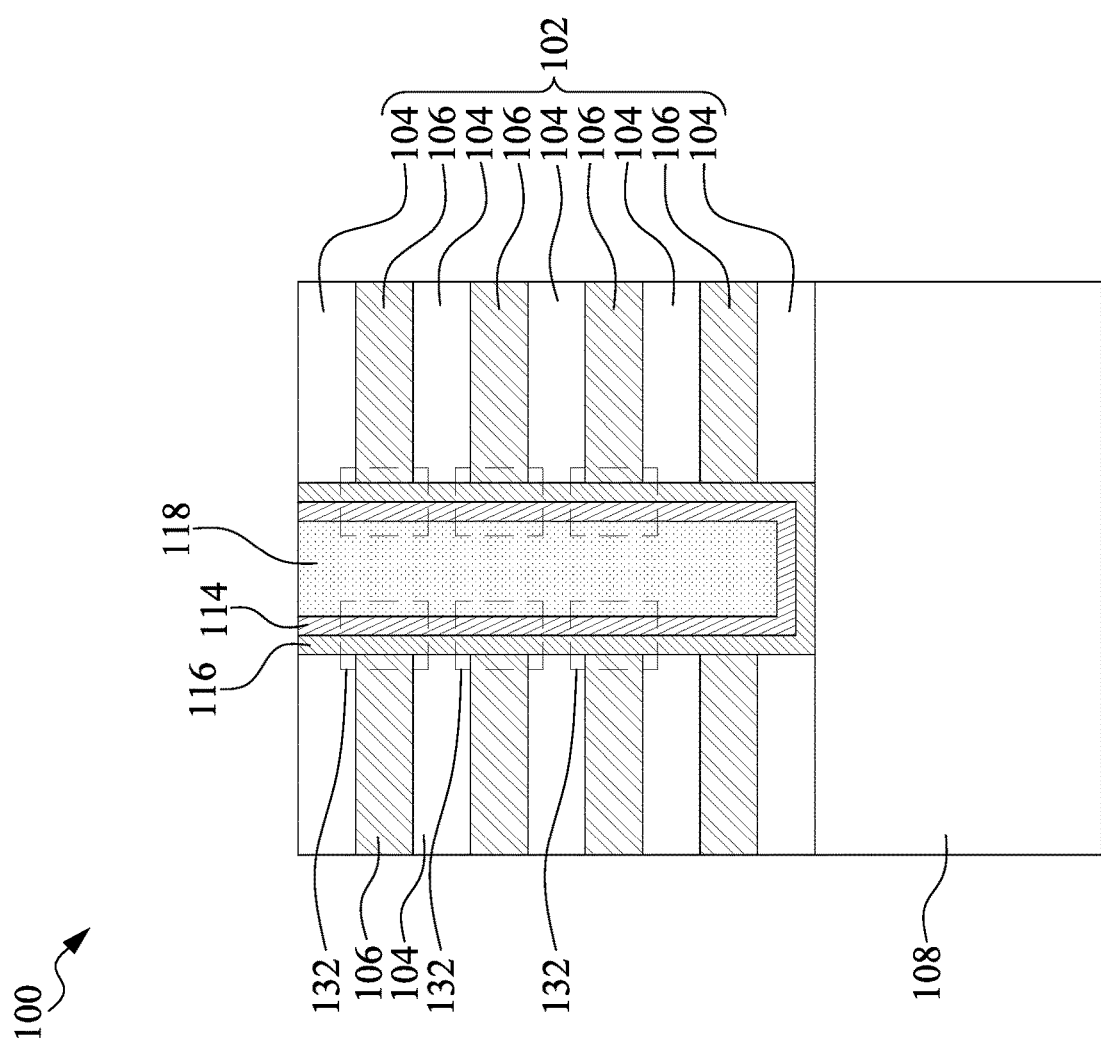
FIG. 4 is a cross-sectional view taken along line 2-2' of FIG. 2.

FIG. 3 is a schematic cross-sectional view taken along line 1-1' of FIG. 2. FIG. 4 is a schematic cross-sectional view taken along line 2-2' of FIG. 2. As shown in FIG. 3, the semiconductor memory device 100 includes the stack 102 of the insulating layer 104 and the first conductive layers 106 sequentially located over the substrate 108 (see FIG. 1) and the central portions 112 perpendicularly penetrating the stack 102. The central portions 112 respectively include a bit line 120, the source 122 and the channel isolation structure 118. The semiconductor memory device 100 further includes the ferroelectric layer 116 surrounding a bottom and sidewalls of the each central portion 112, and the semiconductor layer 114 disposed between the central portion 112 and the ferroelectric layer 116. In some embodiments, the ferroelectric layer 116 penetrates through the stack 102 and is in contact with the substrate 108 (see FIG. 1). In some embodiments, the first conductive layers 106 correspond to word lines. In some embodiments, the ferroelectric layers 116 are disposed between the word lines 106 and the bit line 120 or between the word line 106 and the source line 122 (see FIG. 1). In some embodiments, the ferroelectric layers 116 are used to electrically isolate the word lines 106 from the bit lines 120 and source line 122 (see FIG. 1). As shown in FIG. 3, a word line 106 can control two adjacent unit cells 132 in the same level. As shown in FIG. 4, the channel isolation structure 118 perpendicularly penetrates the stack 102. In some embodiments, the channel isolation structure 118 electrically isolates the bit line 120 and the source line 122.

Figure 5:
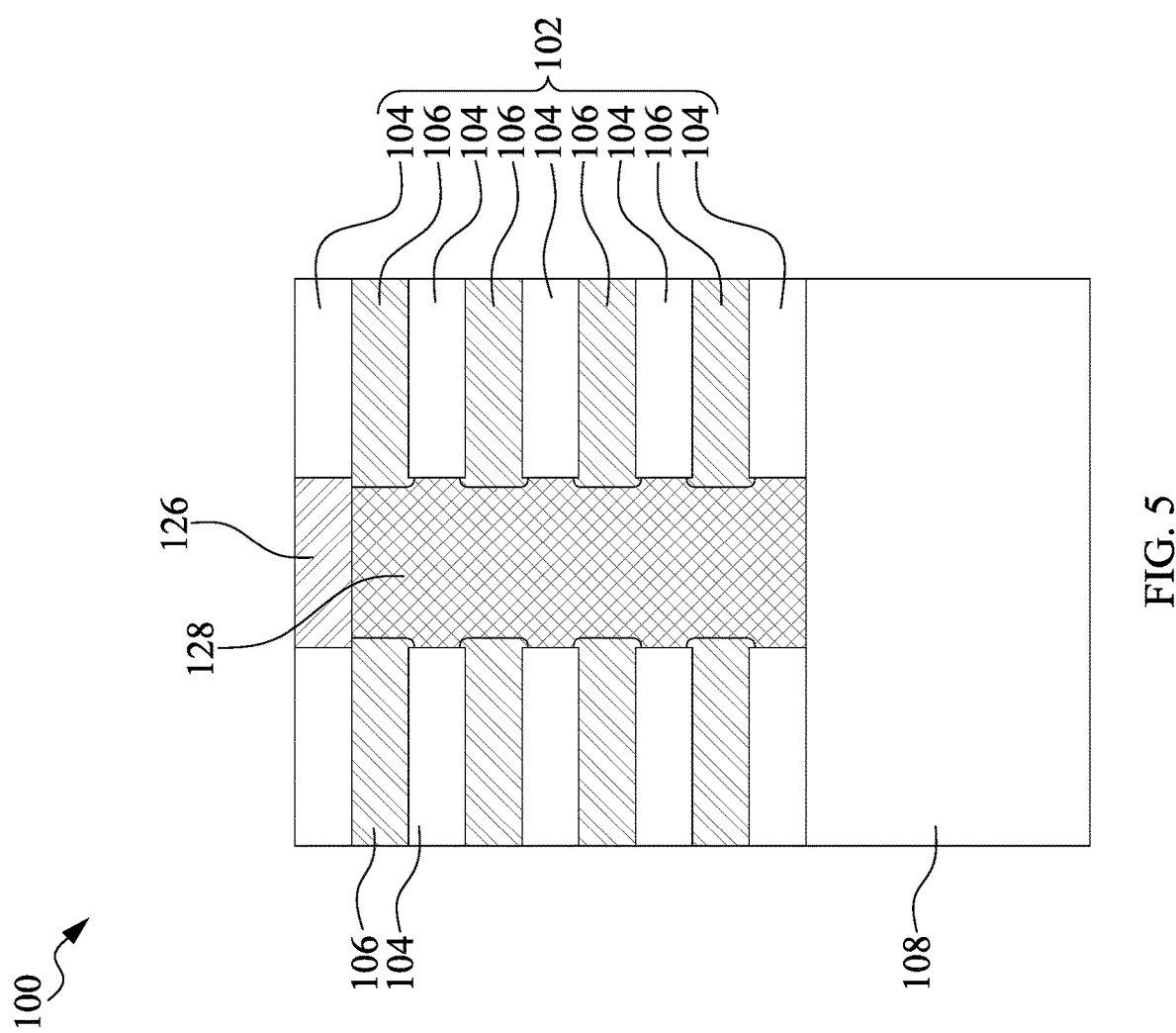
FIG. 5 is a cross-sectional view taken along line 3-3' of FIG. 2.

FIG. 5 is a schematic cross-sectional view taken along line 3-3' of FIG. 2. As shown in FIG. 5, the cell isolation structure 124 perpendicularly penetrates the stack 102 and is in contact with the substrate 108 (see FIG. 1). In some embodiments, the first conductive layers 106 corresponding to the word lines horizontally extend into the bottom portion 128 of the cell isolation structure 124. In some embodiments, the top portion 126 is formed of a material having an etch selectivity with respect to the insulating layers 104. In some embodiments, the bottom portion 128 is formed of material having an etch selectivity with respect to the insulating layers 104. In some embodiments, the top portion 126 is formed of a material having a higher hardness than the insulating layers 104. In some embodiments, the top surface of the top portion 126 of the cell isolation structure 124 is substantially coplanar with the top surface of the stack 102.

Figure 6:
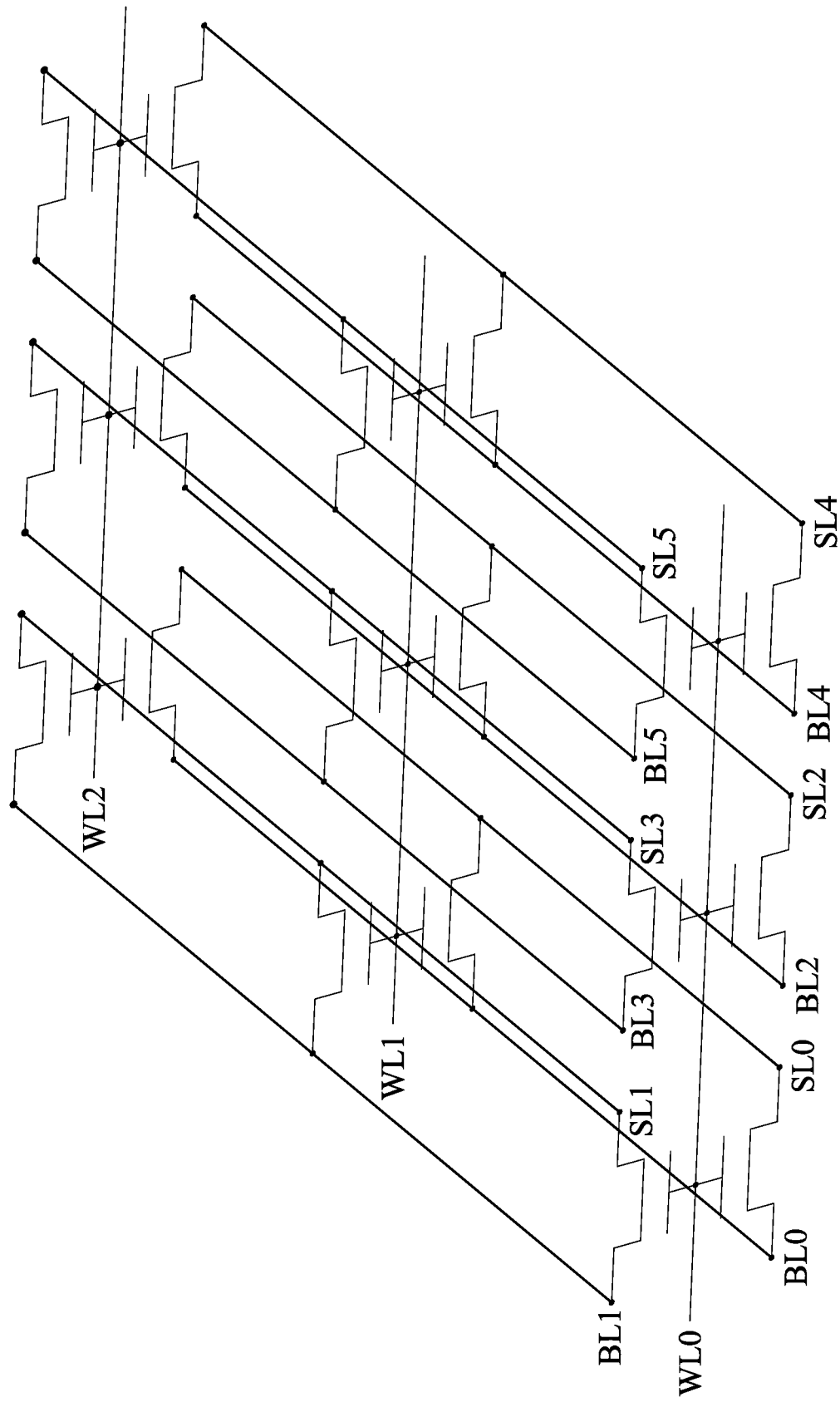
FIG. 6 is a schematic view illustrating a simplified equivalent circuit diagram of the memory cell array of the semiconductor memory device in accordance with some embodiments of the present disclosure.

FIG. 6 is a schematic view illustrating a simplified equivalent circuit diagram of the memory cell array of the semiconductor memory device in accordance with some embodiments of the present disclosure. In some embodiments, a memory array includes a plurality of memory cells arranged in an array configuration. As shown in FIG. 6, there are three rows with associated word lines WL0, WL1 and WL2 extending in parallel along x direction; six bit lines BL0, BL1, BL2, BL3, BL4 and BL5 arranged along y direction; and six source lines SL0, SL1, SL2, SL3, SL4 and SL5 arranged along y direction. As shown in FIG. 6, the memory device comprising eighteen transistors with three words lines, six bit lines, and six source lines is illustrated for simplicity of explanation. The numbers of word lines, bit lines and source lines can be varied to the needs of particular applications. In some embodiments, the memory cells are controlled by memory control lines such as bit lines, source lines, and word lines, usually in a perpendicular arrangement. In some embodiments, a combined selection of a particular bit line of the plurality of bit lines BL, a particular source line of the plurality of source lines SL, and a particular word line of the plurality of word lines WL, identifies a particular memory cell.

In some embodiments, the memory unit cells are configured in a 3D NOR type configuration as shown in FIG. 6. In some embodiments, the memory circuit may be designed to have two transistors sharing the same gate coupled to a word line WL. In some embodiments, the two transistors are located at opposite side of the word line WL. In some embodiments, the memory circuit may be designed to have the transistors of the same row connected to the same word line, while source terminals of the transistors at the same side of the word line of the same column are connected to the same source line SL, and drain terminals of the transistors of the same column at the same side of the word line are connected to the same bit line BL. In some embodiments, each memory cell comprises two transistors coupled to the same word line WL, while a source terminal of one transistor and a source terminal of the other transistor are respectively coupled to different source line SL, and a drain terminal of one transistor and a drain terminal of the other transistor are respectively coupled to different bit line BL.

Figure 7:
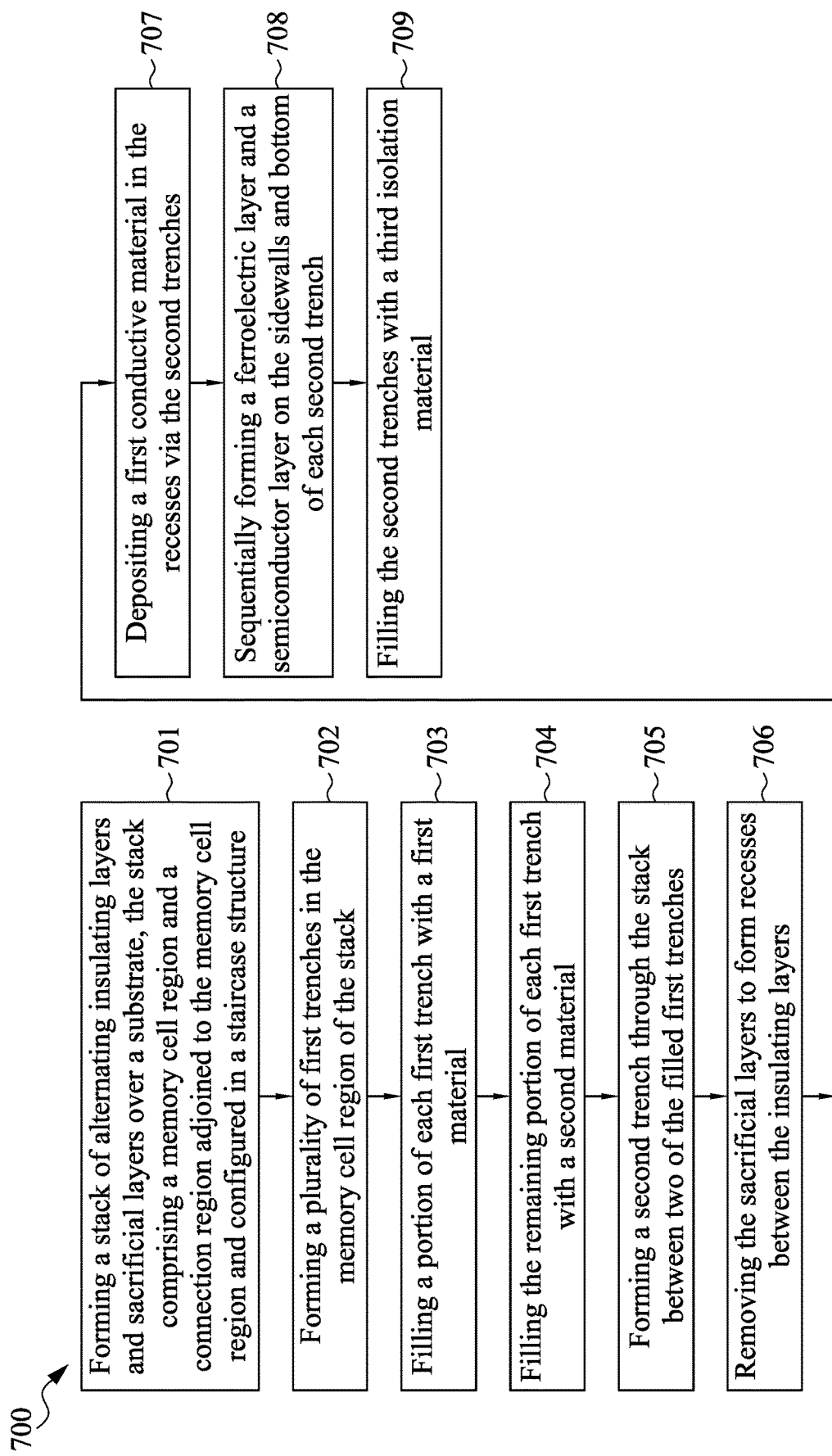
FIG. 7 is a flow diagram of a method of manufacturing a semiconductor memory device in accordance with some embodiments of the present disclosure.

In some embodiments, a method of manufacturing a semiconductor memory device 100 is also disclosed. FIG. 7 is a flowchart of an embodiment of the method 700 of manufacturing the semiconductor memory device 100. FIGS. 8A, 9A, 10A, 11A, 12A, 13A, 14A and 15A are schematic views of manufacturing a semiconductor memory device 100 by the method of FIG. 7 in accordance with some embodiments of the present disclosure. FIGS. 8B, 9B, 10B, 11B, 12B, 13B, 14B and 15B are schematic cross-sectional views taken along line I-I' of FIGS. 8A, 9A, 10A, 11A, 12A, 13A, 14A and 15A. In some embodiments, the semiconductor memory device 100 can be formed by the method 700, but the disclosure is not limited thereto. The method 700 includes a number of operations (701, 702, 703, 704, 705, 706, 707, 708 and 709) and the description and illustration are not deemed as a limitation as the sequence of the operations and the structure of the semiconductor memory device. In FIGS. 8A to 15A and 8B to 15B, like reference numerals will be given to like portions to those which have already been described above so as to omit the repetition of similar descriptions. In addition, portions about which no particular description will be made have the similar constructions to those of the semiconductor memory structure 100 described above and provide the same advantages provided thereby.

In some embodiments, the method 700 of manufacturing a semiconductor memory device includes the steps of forming a stack of alternating insulating layers and sacrificial layers over a substrate, the stack comprising a memory cell region and a connection region adjoined to the memory cell region and configured in a staircase structure 701; forming a plurality of first trenches in the memory cell region of the stack 702; filling a portion of each first trench with a first material 703; filling the remaining portion of each first trench with a second material 704; forming a second trench through the stack between two of the filled first trenches 705; removing the sacrificial layers to form recesses between the insulating layers 706; depositing a first conductive material in the recesses via the second trenches 707; sequentially forming a ferroelectric layer and a semiconductor layer on the sidewalls and bottom of each second trench 708; and filling the second trenches with a third material 709. In some embodiments, the method 700 further includes the steps of removing a portion of the third isolation material to form a plurality of third trenches and a plurality of fourth trenches apart from the third trenches; and depositing a second conductive layer in the third trenches to form bit lines and depositing a third conductive layer in the fourth trenches.

Figure 8A:
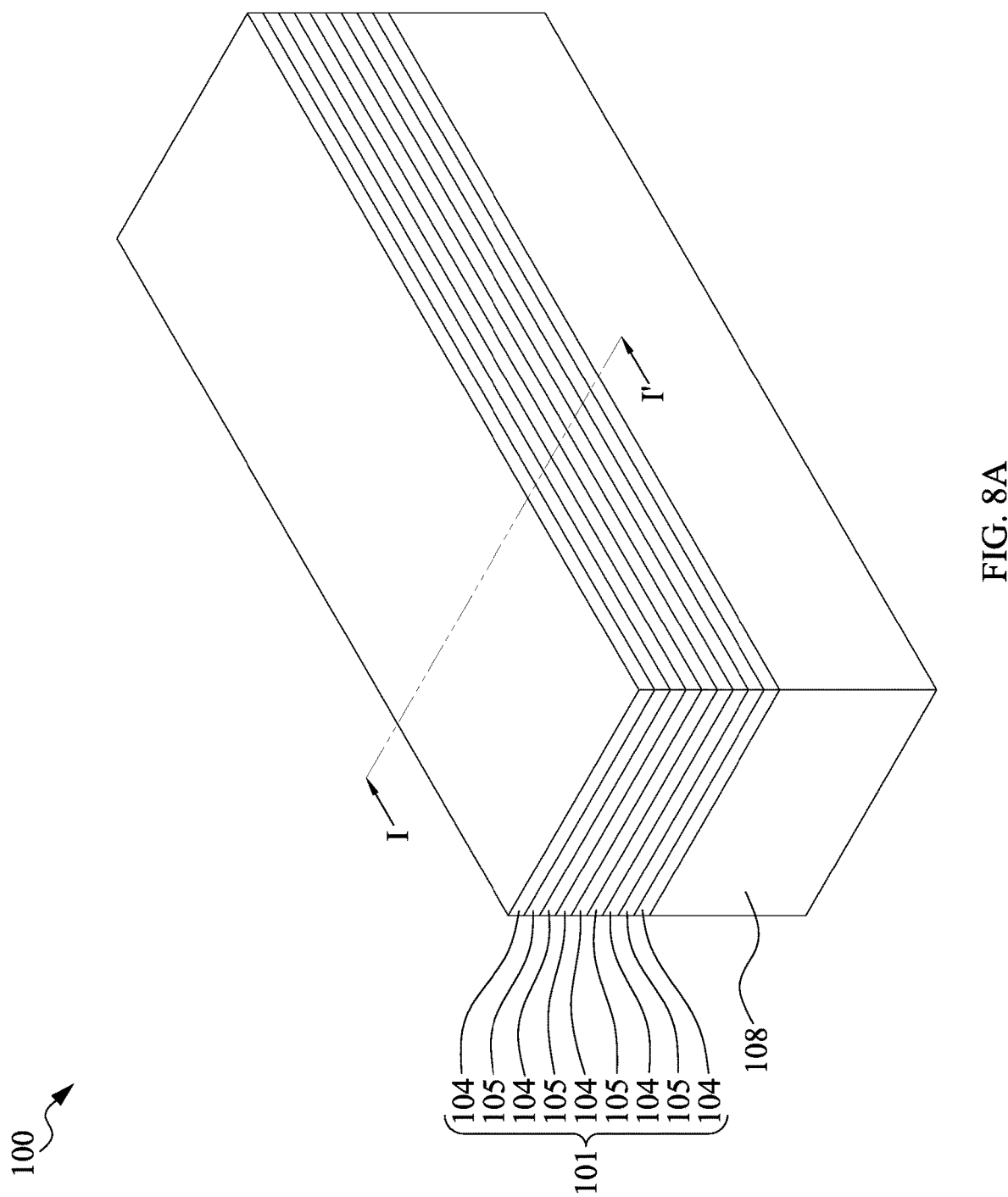
FIGS. 8A, 9A, 10A, 11A, 12A, 13A, 14A and 15A are schematic views of manufacturing a semiconductor memory device in accordance with some embodiments of the present disclosure.
Figure 8B:
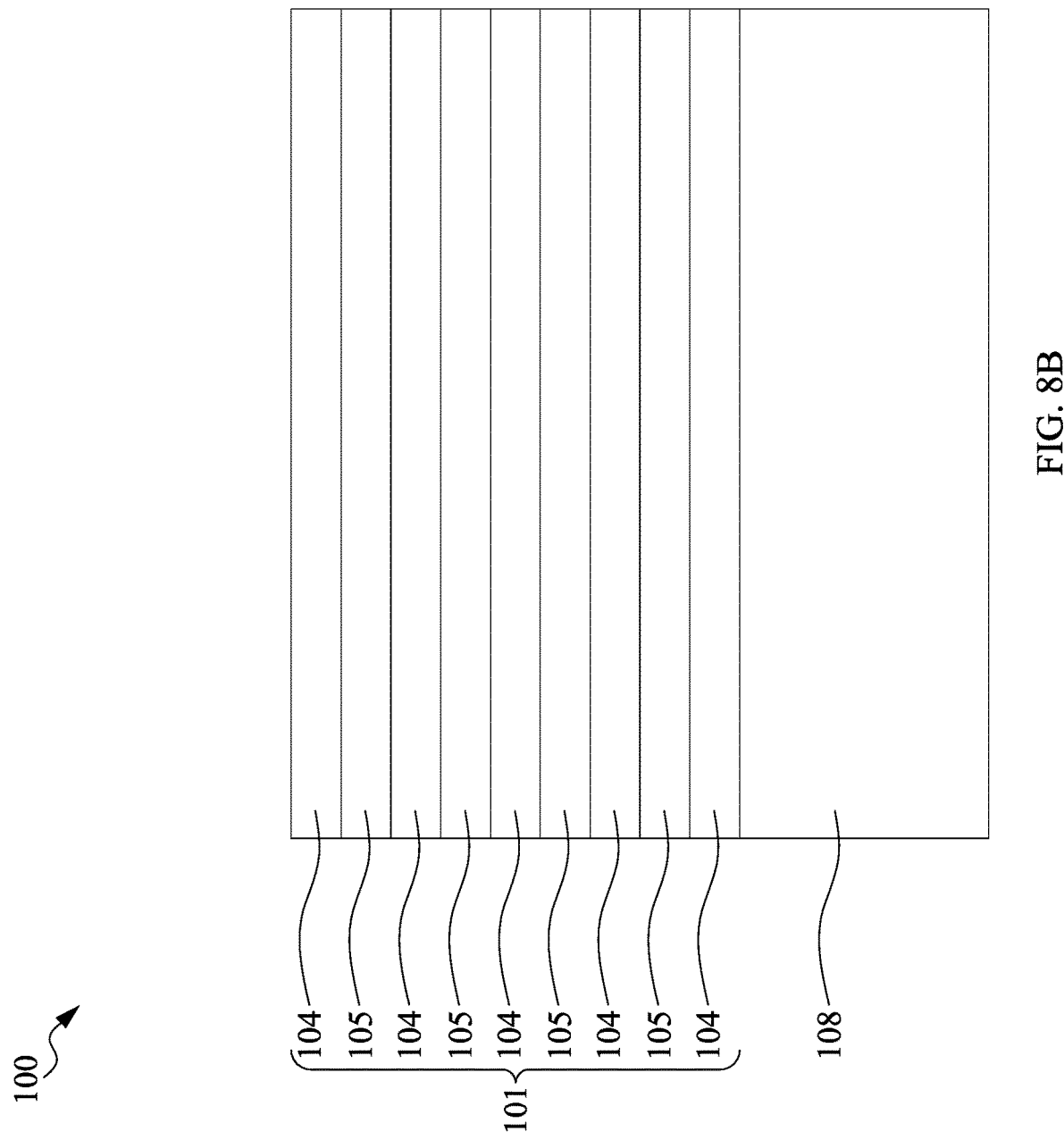
FIGS. 8B, 9B, 10B, 11B, 12B, 13B, 14B and 15B are schematic cross-sectional views taken along line I-I' of FIGS. 8A, 9A, 10A, 11A, 12A, 13A, 14A and 15A.

In operation 701, a stack 101 of alternating insulating layers 104 and sacrificial layers 105 over a substrate 108 is formed as shown in FIGS. 8A and 8B. In some embodiments, the substrate 108 is provided as having already undergone several processing steps. In some embodiments, the substrate 108 may be any suitable substrate such as a silicon, germanium, silicon-germanium, undoped, doped, bulk, silicon-on-insulator ("SOI") or other substrate with or without additional circuitry. In some embodiments, the stack 101 includes a plurality of insulating layers 104 and a plurality of sacrificial layers 105, which are parallel to each other and sequentially stacked. In some embodiments, the uppermost layer of the stack 101 is the insulating layer 104. In some embodiments, the number of the alternating layers included in the stack 101 can be made as high as the number of layers needed. In some embodiments, the stack 101 may include between 16 and 512 layers of alternating insulating layers 104 and sacrificial layers 105, whereby each insulating or sacrificial layer constitutes one layer.

In some embodiments, the sacrificial layers 105 (e.g., silicon nitride (SiN)) will be replaced by metal to form word lines. In some embodiments, the insulating layers 104 (e.g., silicon oxide ($SiO_2$)) will be used as the insulating layers between the metal word lines. Other insulating materials could be used instead of silicon oxide. Other sacrificial materials could be used instead of silicon nitride. In some embodiments, each of the insulating layers 104 and the sacrificial layers 105 is deposited to about the same thickness. In some embodiments, the insulating layers and the sacrificial layers for forming the alternating stack may be deposited using any suitable technique, such as atomic layer deposition (ALD), plasma enhanced atomic layer deposition (PEALD), chemical vapor deposition (CVD), plasma enhanced chemical vapor deposition (PECVD), and sputtering. In some embodiments, the insulating layers and the sacrificial layers are deposited by PECVD.

Figure 9A:
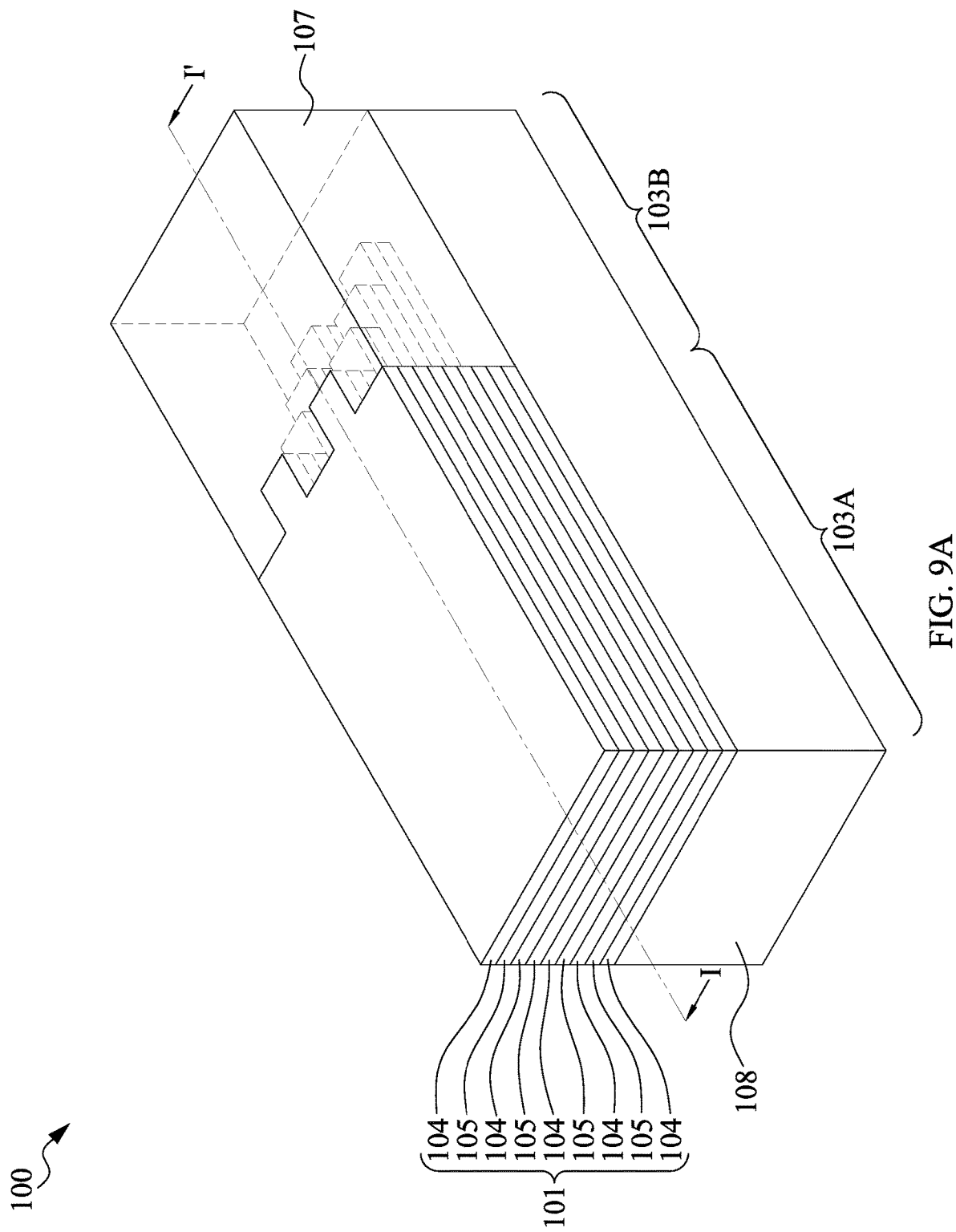
Figure 9B:
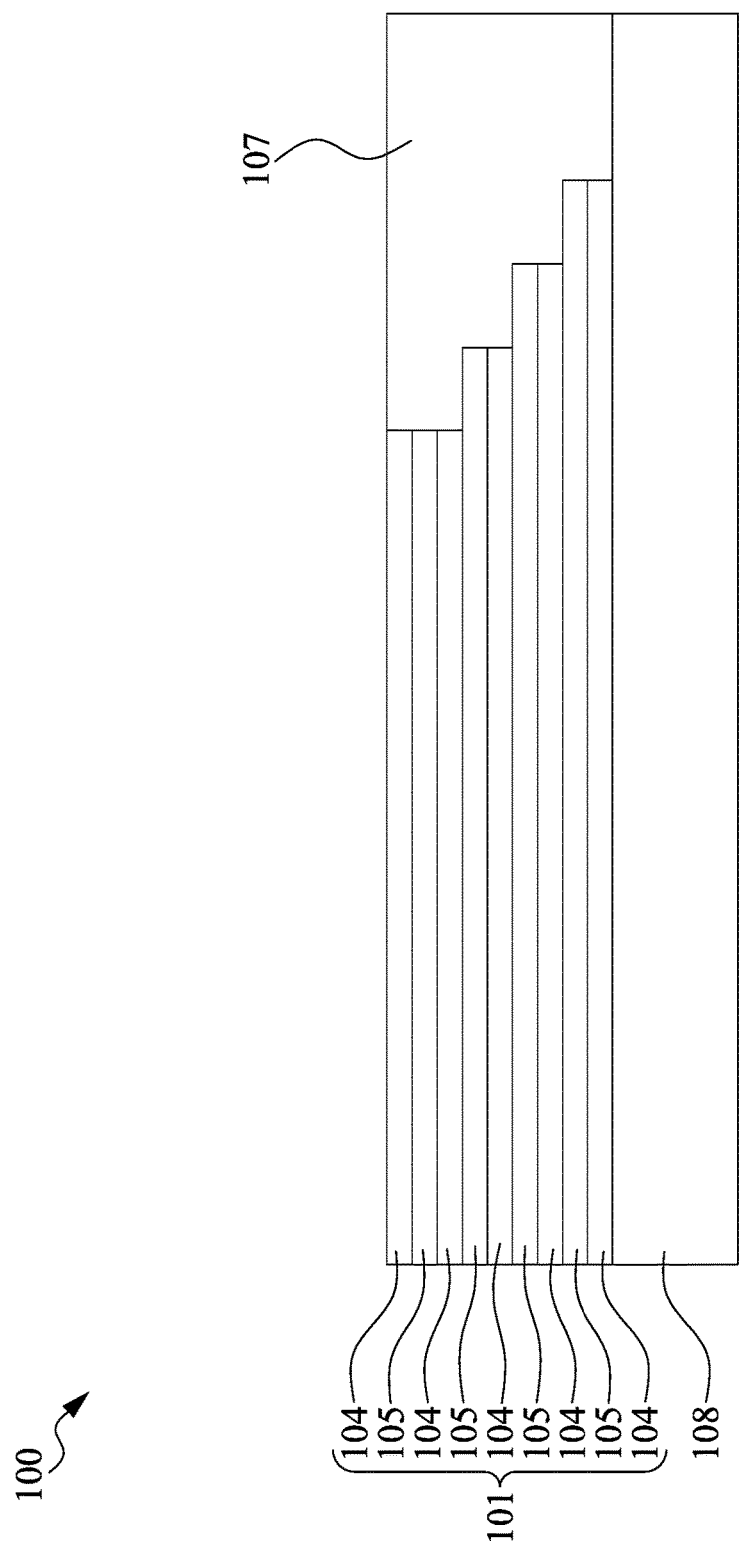

As shown in FIGS. 9A and 9B, the stack 101 comprises a memory cell region 103A and a connection region 103B adjoined to the memory cell region 103A. In some embodiments, following deposition of the stack 101, a staircase pattern of the stack 101 is formed in the connection region 103B on the substrate 108. In some embodiments, a "staircase pattern" as referred to herein includes two or more steps, each step including an insulating layer 104 and the sacrificial layer 105. In some embodiments, the top layer of each set of oxide and nitride layers is an insulating layer for formation of steps in a staircase. Moreover, although FIG. 9B shows four steps of a staircase pattern, it will be understood that the steps of a staircase pattern can vary depending upon the applications. In some embodiments, the staircase pattern includes between 24 and 256 steps. The staircase pattern may be formed using a variety of patterning techniques. In some embodiments, the staircase pattern is covered by photoresist 107 for protection after it is formed.

Figure 10A:
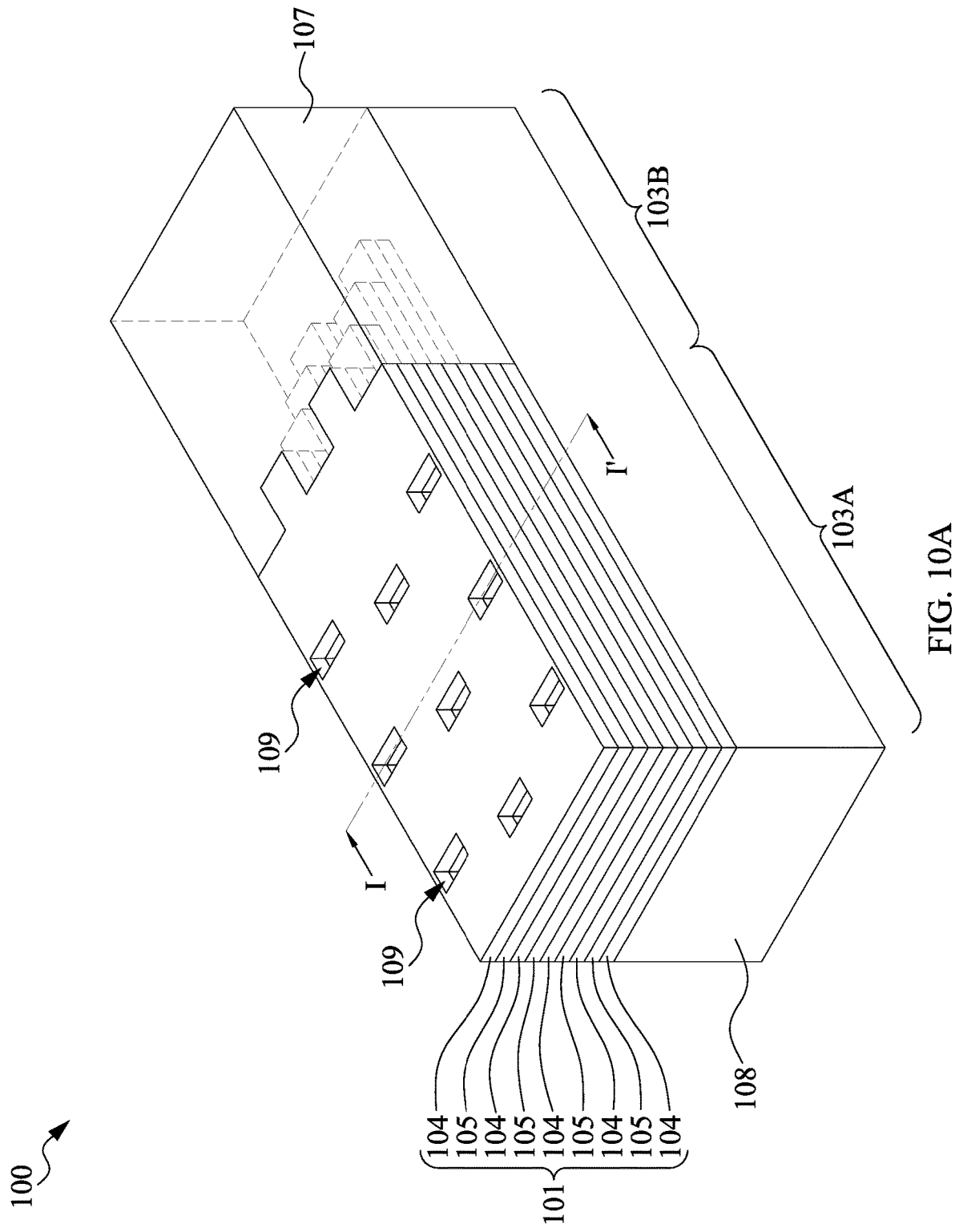
Figure 10B:
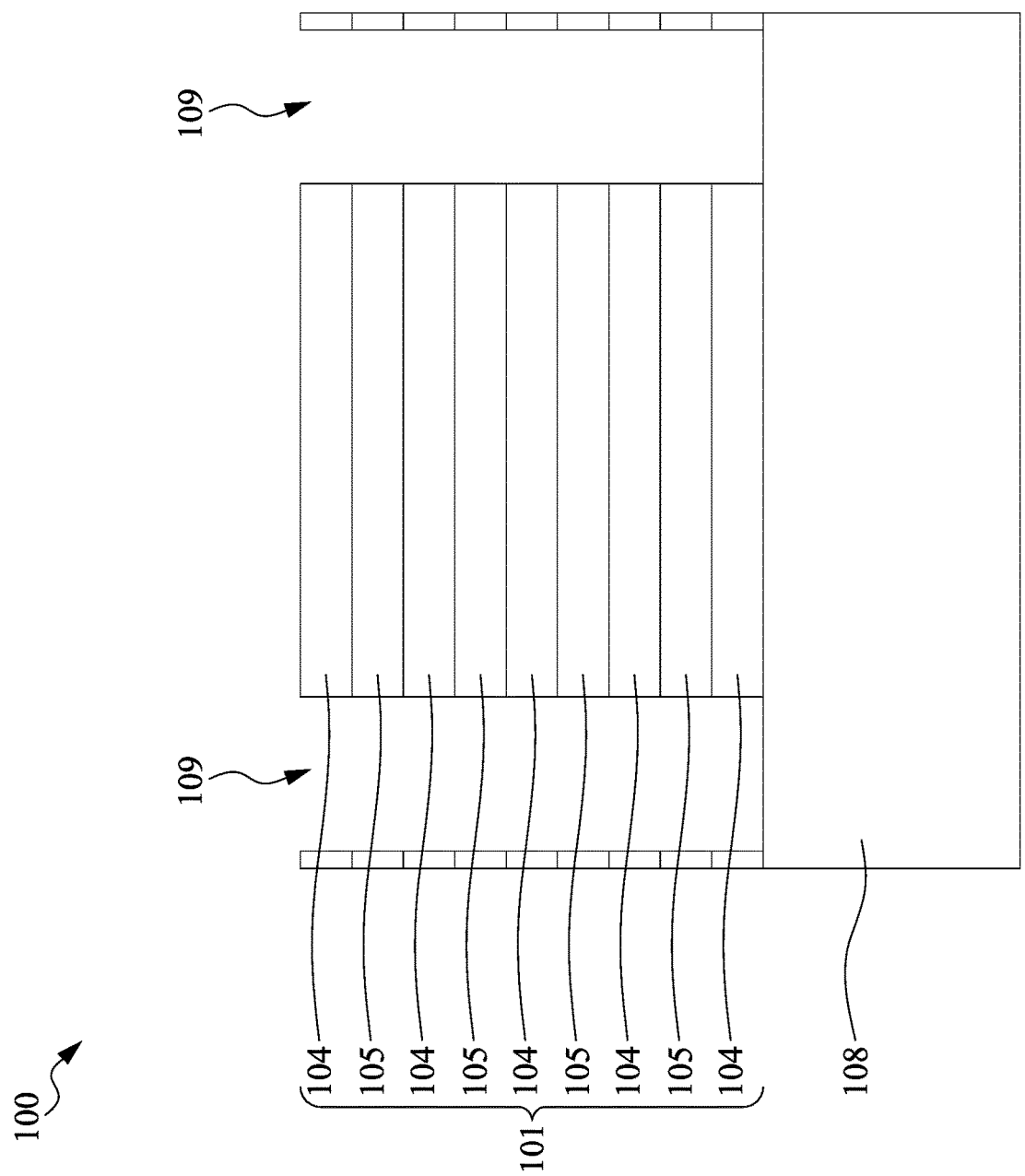

Operation 702 includes forming a plurality of first trenches 109 in the memory cell region 103A of the stack 101 as shown in FIGS. 10A and 10B. In some embodiments, a plurality of the first trenches 109 are formed in the alternating insulating layers (e.g., silicon oxide)/sacrificial layers (e.g., silicon nitride). In some embodiments, the first trenches 109 penetrate through the stack 101 and are perpendicular to the surface of the substrate 108. In some embodiments, the first trenches 109 are formed by a patterning process such as lithography and etching operations. In some embodiments, the patterning process includes forming a hard mask and a photoresist (not shown) on the stack 101, performing a lithography process to define first trenches on the stack 101 in the photoresist and the hard mask, and then removing the photoresist and performing a dry etching process to form the first trenches 109 in the stack 101 through the hard mask. In some embodiments, the first trenches are formed in a staggered array configuration. In some embodiments, the number of the first trenches 109 can be made as high as the number of they needed. In some embodiments, the first trenches 109 may include square shaped grooves, rectangular shaped grooves, round shaped grooves, oval shaped grooves or the like.

Figure 11A:
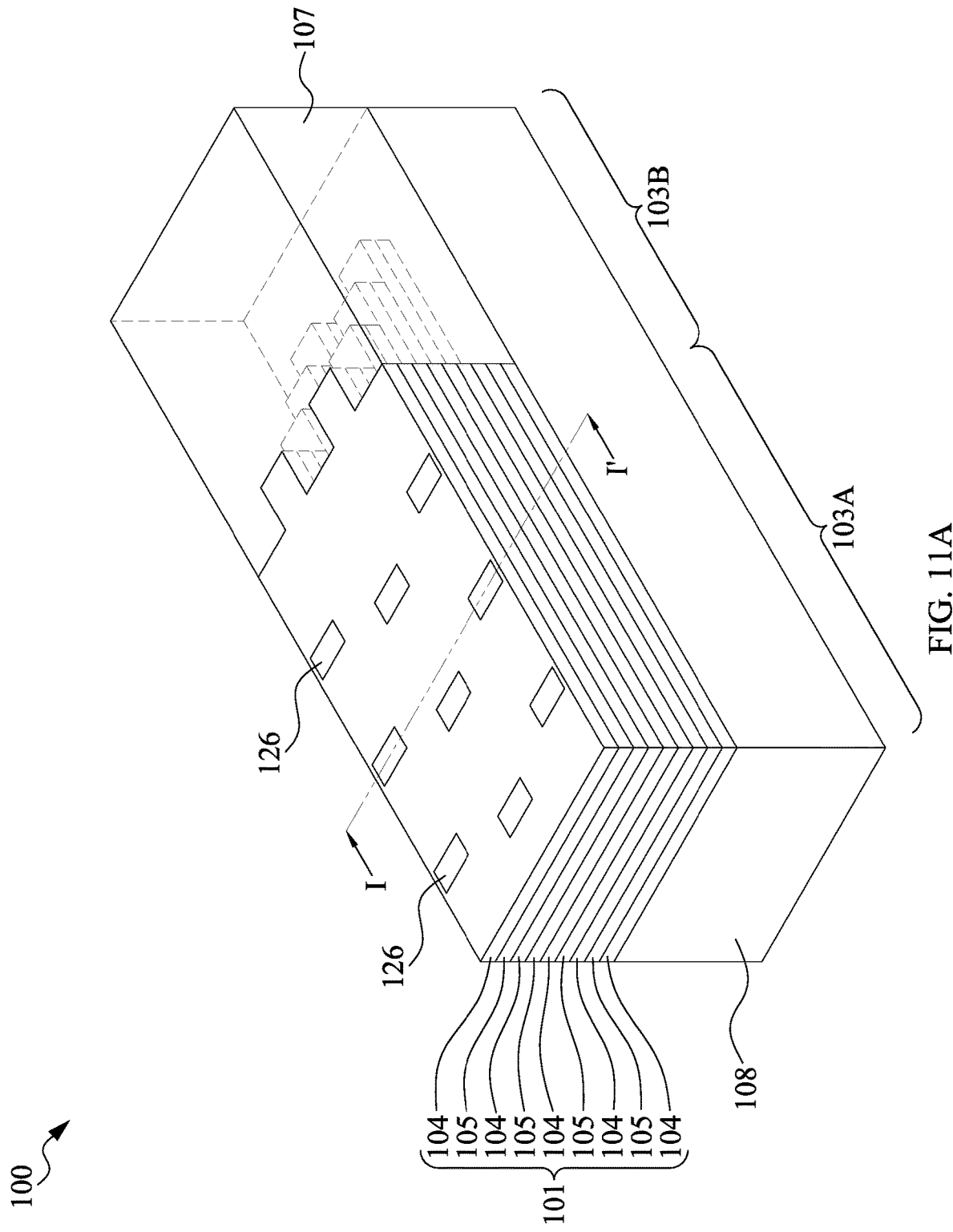
Figure 11B:
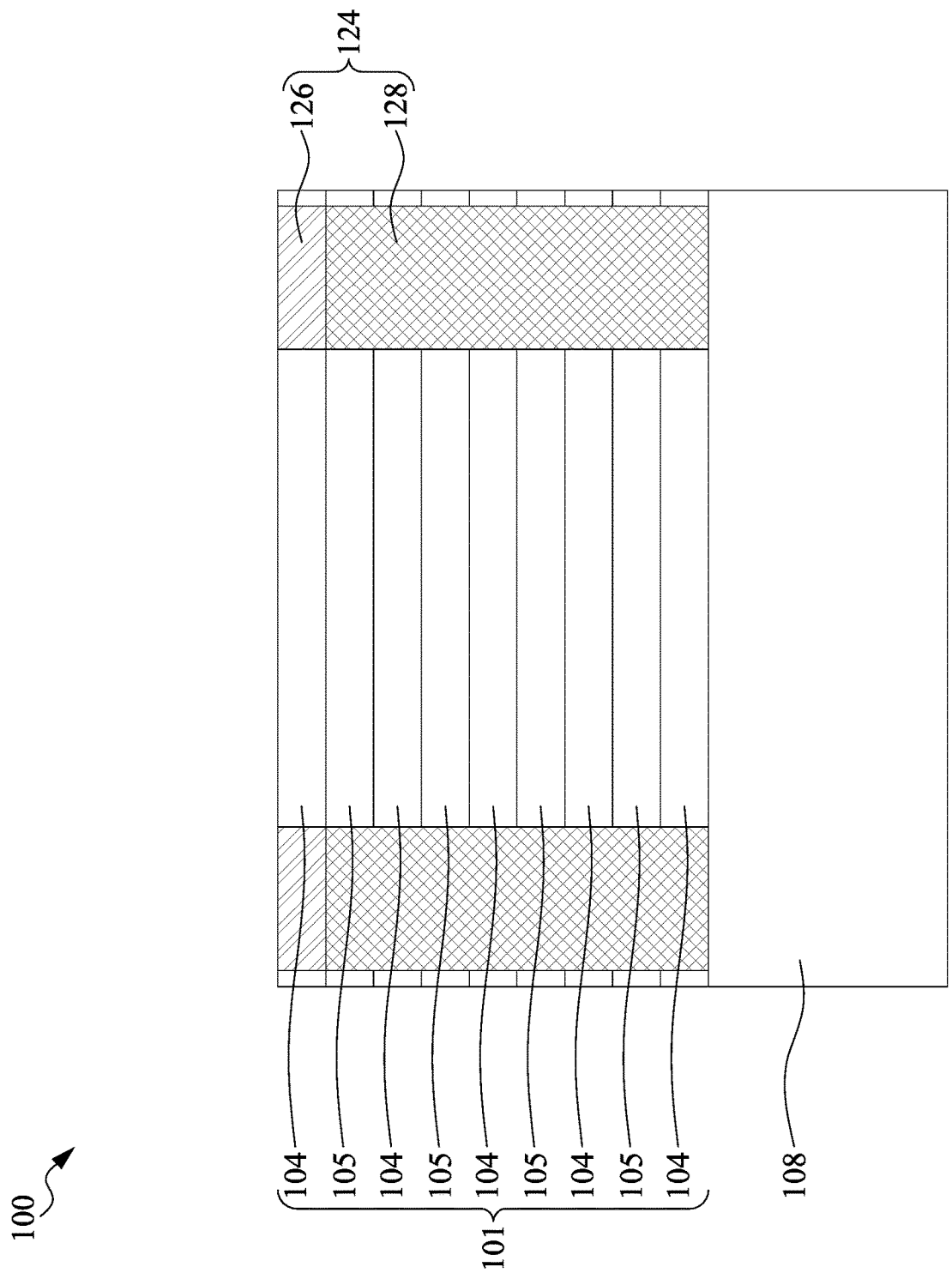

Operations 703 and 704 include filling a portion of each first trench 109 with a first material to form the bottom portion 128, and filling the remaining portion of each first trench 109 with a second material to form the top portion 126 as shown in FIGS. 11A and 11B. In some embodiments, the filled first trenches serve as call isolation structures 124. In some embodiments, the cell isolation structures 124 will serve as struts during subsequent etching processes. The cell isolation structures 124 can effectively improve mechanical strength of the stacked structure. In some embodiments, a thickness of the top portion 126 can be less than, similar to, or higher than a thickness of the bottom portion 124. In some embodiments, a thickness of the top portion 126 can be similar to or higher than a thickness of the insulating layer 104.

As shown in FIG. 11B, the first trenches 109 are filled with two different materials so as to form the cell isolation structures 124. In some embodiments, the bottom portions 128 are formed of a first material and the top portions 126 are formed of a second material. In some embodiments, the first material has an etch selectivity ratio different from that of the second material. In some embodiments, the first material has a hardness higher than the second material. In some embodiments, the second material has an etch selectivity ratio different from that of the insulating layers 124 of the stack 101. In some embodiments, the second material has a hardness higher than the insulating layers 124 of the stack 101. In some embodiments, the top portions 126 of the cell isolation structures 124 can serve as a hard head to protect the struts/cell isolation structures 124 during the subsequent word line etch process, so as to decrease height loss of the struts/cell isolation structures 124. In some embodiments, the cell isolation structures 124 serve as struts which support the insulating layers 124 when the sacrificial layers 126 are removed by etching. In some embodiments, the first material may include an isolation dielectric, such as silicon oxide and silicon nitride, but is not limited to the above-mentioned materials. In some embodiments, the second material may include SiCN, $Al_2O_3$ or other isolation dielectrics, such as $HfO_2$, SiON, and $La_2O_3$, but is not limited to the above-mentioned materials. In some embodiments, the height of the top portion 126 and the height of the cell isolation structure 124 are in a ratio ranging from about 1:1 to about 1:100, about 1:1 to about 1:50, about 1:1 to about 1:30, about 1:1 to about 1:20, about 1:1 to about 1:10, or about 1:1 to 1:5, but is not limited to the above-mentioned ratios.

Figure 12A:
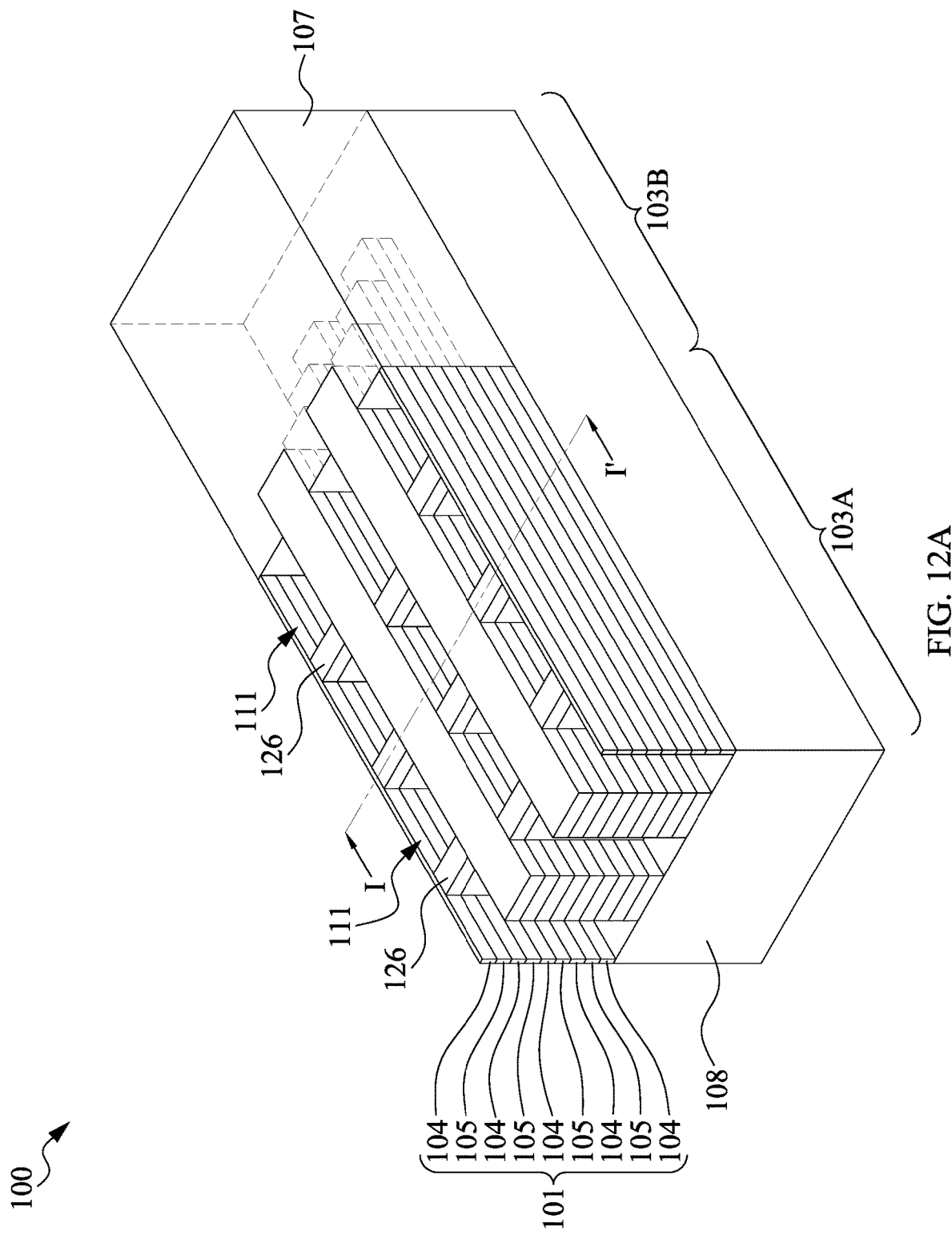
Figure 12B:
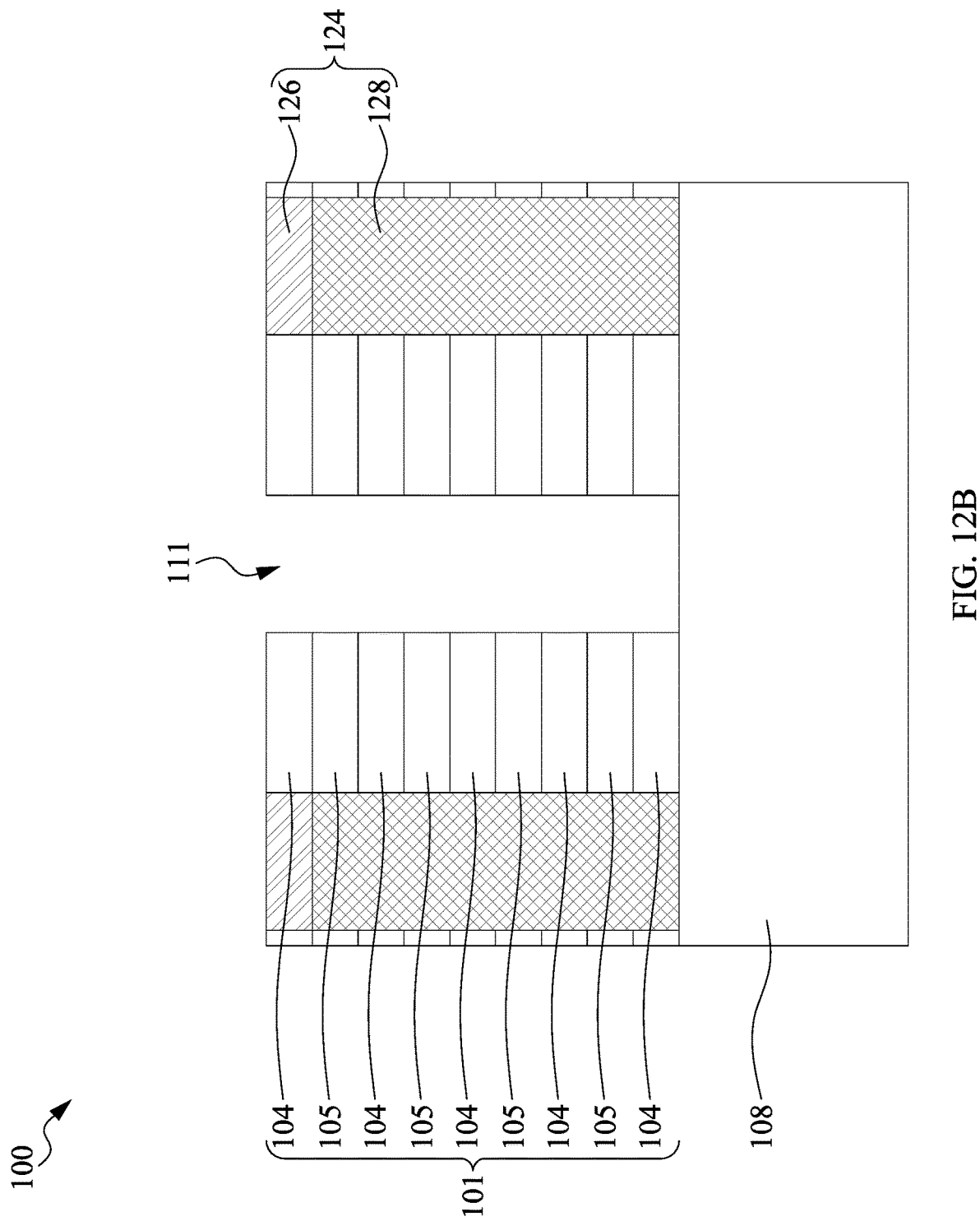

Step 705 includes forming a second trench 111 through the stack 101 between two of the cell isolation structures 124 as shown in FIG. 12A and FIG. 12B. The second trenches 111 are used as memory holes for the subsequent formation of word lines. In some embodiments, a portion of the substrate 108 is exposed via the second trench 111. In some embodiments, the second tranches 111 are formed by any suitable etch processes. In some embodiments, the second trenches are formed by a self-aligned etch process. In some embodiments, reactive ion etching can be used to form the second trenches. During the word line etch process, since the strut/cell isolation structures are protected by hard head, the height loss of the strut/cell isolation structures can be avoided, so that the structural stability can be improved. In some embodiments, the top surfaces of the cell isolation structure 124 are coplanar to a top surface of the stack 101, even after the word line etch process. In some embodiments, the second trenches 111 may include square shaped grooves, rectangular shaped grooves, round shaped grooves, oval shaped grooves or the like.

Figure 13A:
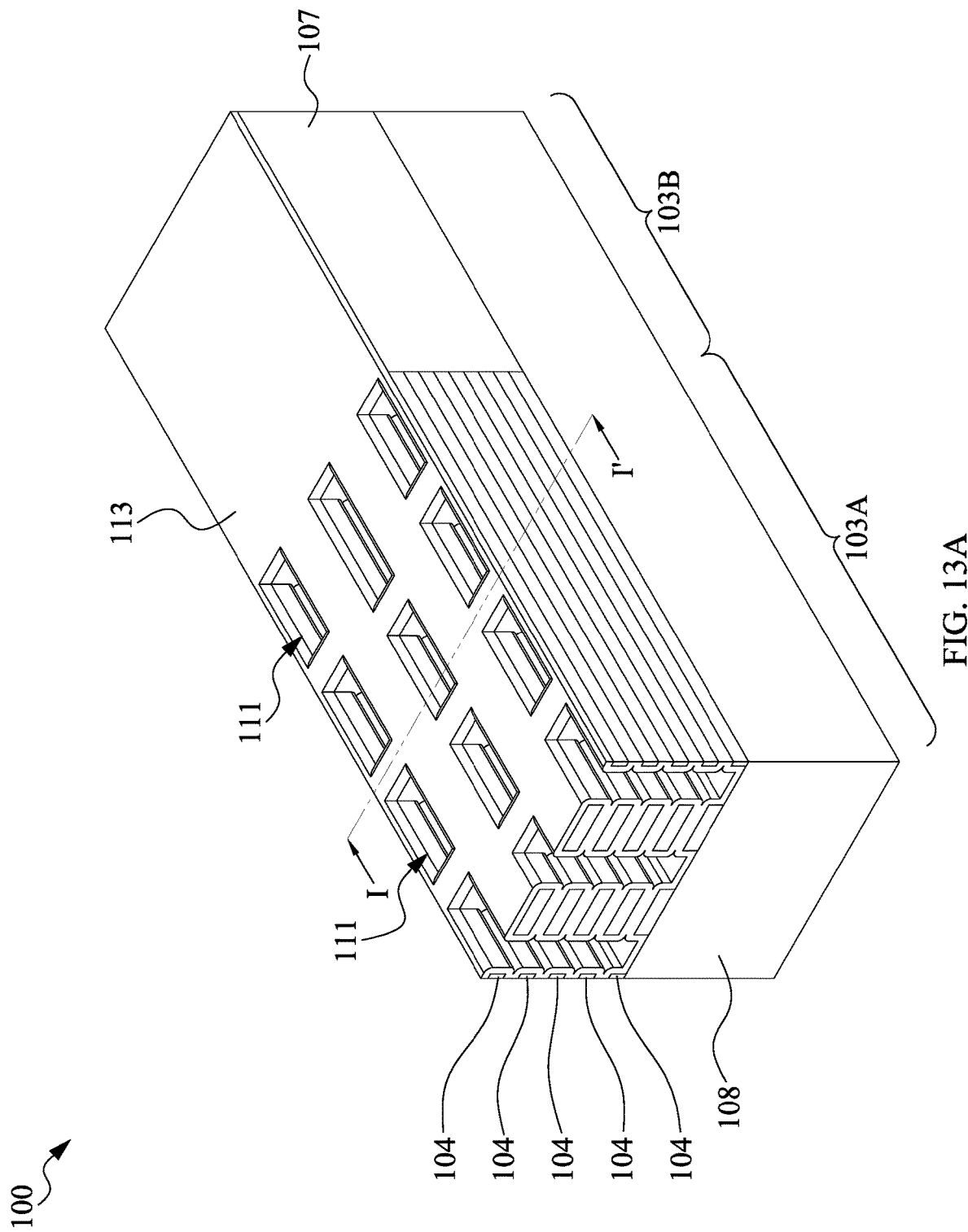
Figure 13B:
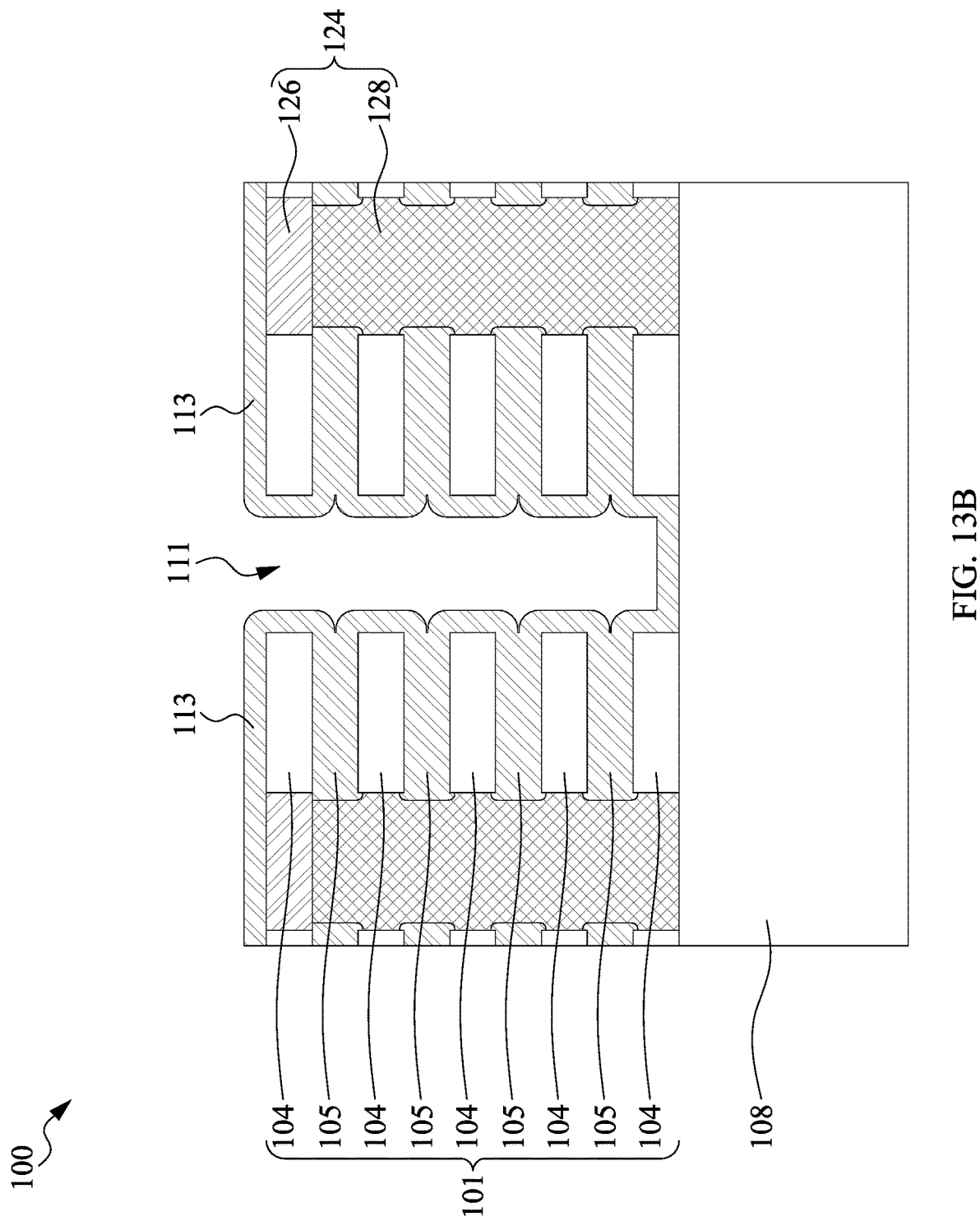

Operations 706 and 707 include removing the sacrificial layers 105 to form recesses (not shown) between the insulating layers 104, and depositing a first conductive material 113 in the recesses via the second trenches 111 as shown in FIGS. 13A and 13B. In some embodiments, the sacrificial layers (e.g., silicon nitride layers) 105 are replaced with conductive layers to form word lines. In some embodiments, silicon nitride is selectively etched relative to silicon oxide over the substrate 108 via the second trenches 111. In some embodiments, the removal of the silicon nitride layers may involve introducing an etchant via the second trenches 111, which has a higher selectivity for the silicon nitride, and removing the silicon nitride layers. In some embodiments, the silicon nitride layers 105 in the staircase connection region 103B are removed during a self-aligned etch process for forming the second trench 111. In some embodiments, the sacrificial layers 105 are removed to form recesses (not shown) between the insulating layers 104 extending along a horizontal direction. In some embodiments, a portion of the bottom portions 208 of the cell isolation structures 204 is laterally etched from the sidewalls of the recesses.

In some embodiments, etching may be performed using a selective dry etch process, such as by exposing the substrate to any one or more of the following gases: chlorine ($Cl_2$), oxygen ($O_2$), nitrous oxide ($N_2O$), or the like, but is not limited thereto. It will be understood that the selective etching involves etching a first material at a rate faster than etching a second material. For example, selectively etching silicon nitride relative to silicon oxide means silicon nitride is etched at a faster rate than etching of silicon oxide. In some embodiments, silicon nitride is selectively etched using a wet etch process, such as by exposing the substrate 108 to phosphoric acid ($H_3PO_4$) and/or diluted hydrofluoric acid or a mixture of the solutions. In some embodiments, the entire silicon nitride layers wherein the word lines are being formed should be removed. In some embodiments, word line layers at different levels should be isolated from one another and not shorted together. In some embodiments, the sacrificial material in the stack may be something other than silicon nitride. Therefore, a different type of etch process and etchant may be used.

After removing the sacrificial layers 105, a first conductive material 113 is formed (e.g., one or more layers) in the recesses via the second trenches 111 as shown in FIGS. 13A and 13B. After replacing the sacrificial layers 105 with the first conductive material 113, a metal/oxide stack is formed. In some embodiments, the first conductive material 113 is provided through the second trenches 111 to fill the recesses left when the sacrificial layers 105 were removed. In some embodiments, the laterally-etched cavities of the bottom portions 128 of the cell isolation structures 124 are also filled with the first conductive material 113. In some embodiments, the first conductive material 113 covers the surface of the uppermost insulating layer 104, the sidewalls of the second trenches 111 and the recesses, and is deposited over the exposed substrate 108. In some embodiments, the first conductive material 113 includes various conductive materials, e.g., metal such as aluminum (Al), titanium (Ti), cobalt (Co), silver (Ag), gold (Au), copper (Cu), nickel (Ni), chromium (Cr), hafnium (Hf), rhodium (Ru), tungsten (W), platinum (Pt) and/or alloys thereof, or a metal nitride such as titanium nitride (TiN), tantalum nitride (TaN), or the like, but is not limited thereto. In some embodiments, chemical vapor deposition (CVD) or atomic layer deposition (ALD) may be used to deposit the first conductive material 113. In some embodiments, the excessive conductive material 113, e.g., the materials outside the recesses, at the bottom of the second trenches 111, and on the surface of the uppermost insulating layers 104, can be removed, e.g., by etching, so that the bottom surfaces of the second trenches 111, the sidewalls of the insulating layers 104, and the surface of the uppermost insulating layers 104 are exposed. In some embodiments, the excessive conductive materials 113 outside the recesses are removed to form vertical memory holes (not shown) in the alternating conductive layers (word line) (e.g., 106 as shown in FIG. 1) and the insulating layers 104.

Figure 14A:
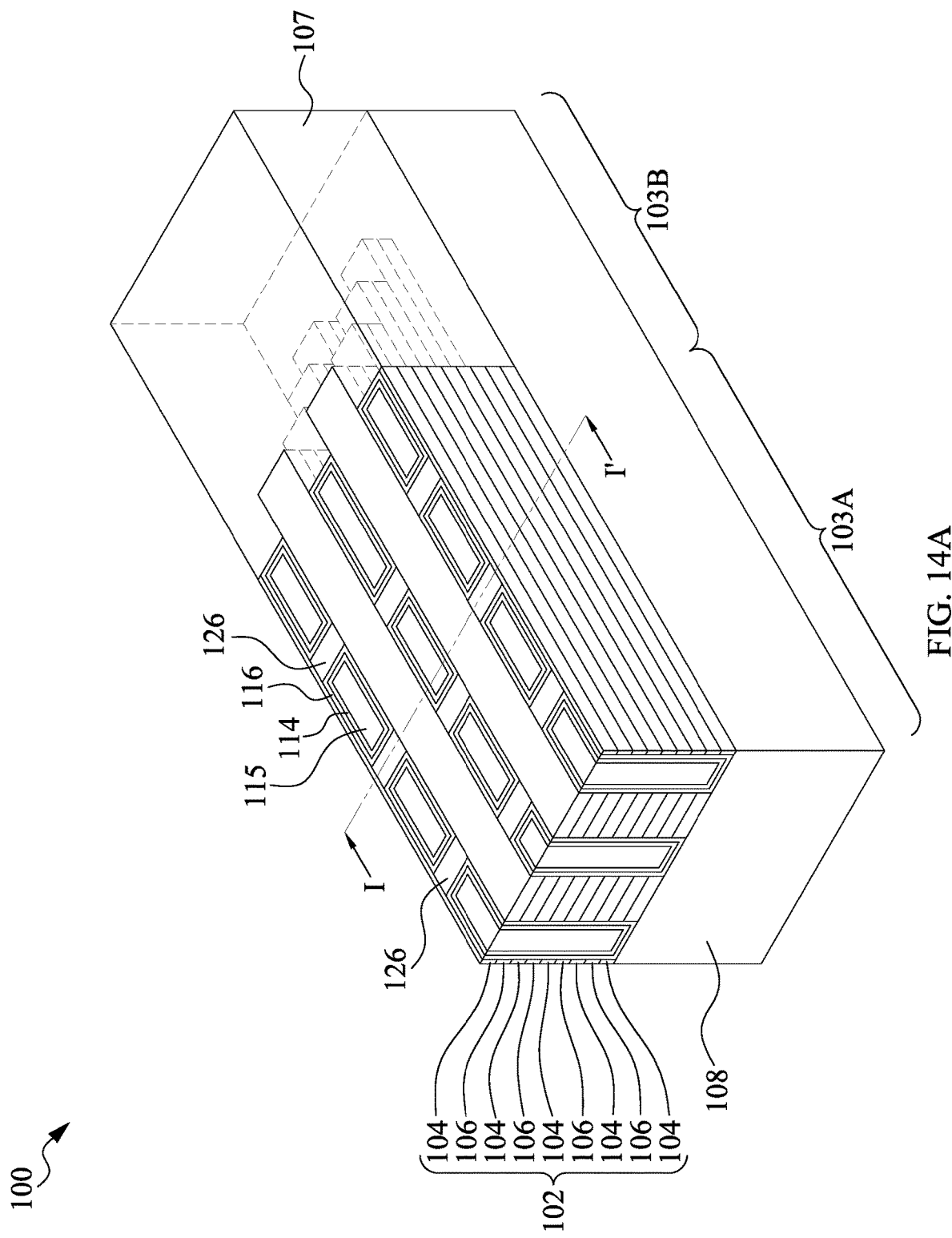
Figure 14B:
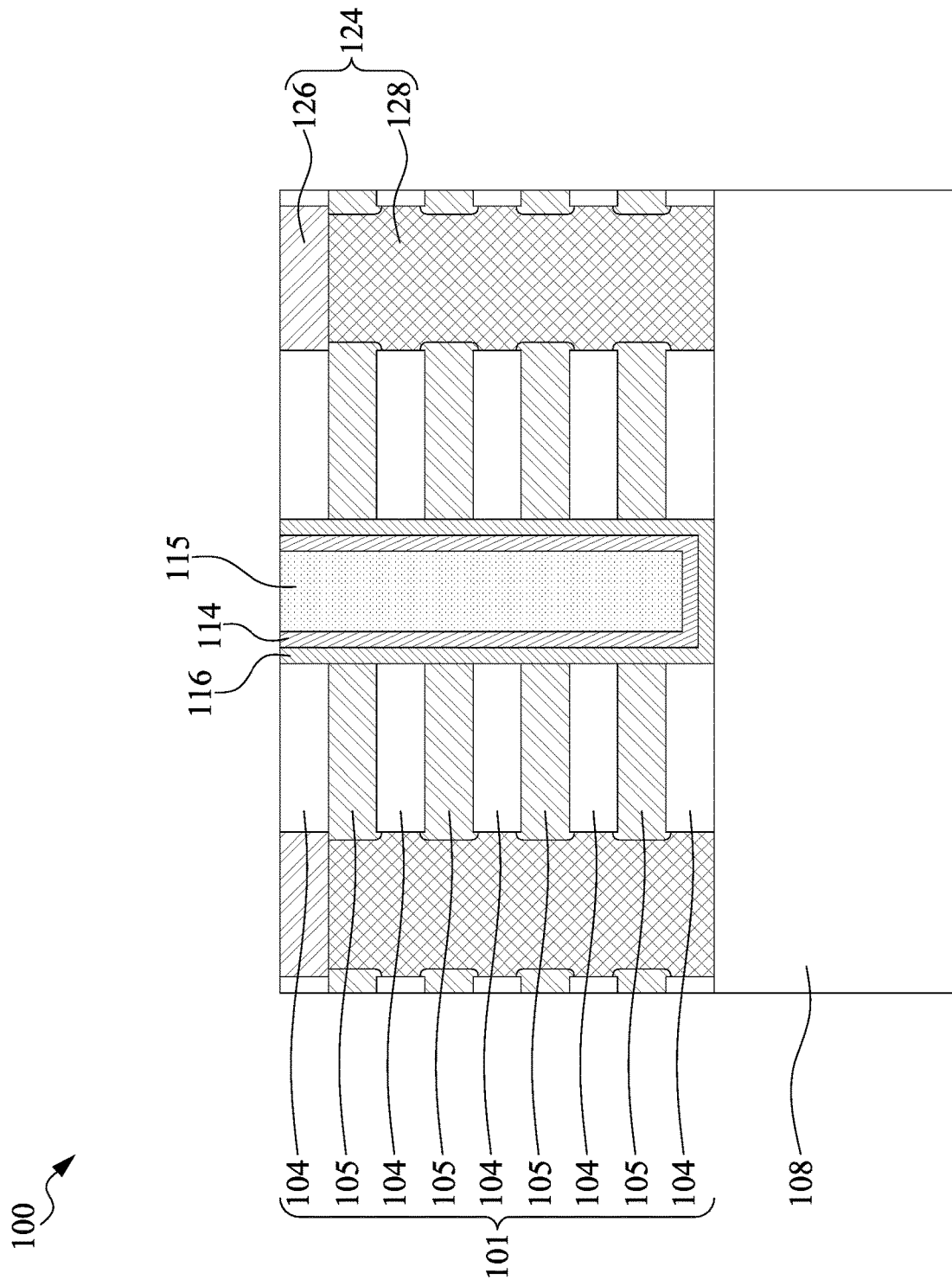

Operations 708 and 709 include sequentially forming a ferroelectric layer 116 and a semiconductor layer 114 on the sidewalls and bottoms of the second trenches 111, and filling the second trenches 111 with a third material 115 as shown in FIGS. 14A and 14B. These layers can be formed by any suitable methods that are known in the art. In some embodiments, the second trenches 111 are filled in by sequentially depositing a ferroelectric layer 116 and a semiconductor layer 114 on the sidewalls and bottoms, e.g., using ALD, and filling the second trenches 111 with a third material 115. In some embodiments, other suitable layers, such as an interfacial layer, e.g., $SiO_2$, SiON, or $Al_2O_3$, can be formed in combination with the ferroelectric layer 116. In some embodiments, the third material 115 is depicted as filling in the central portion of the second trenches 111 and used as a channel isolation structure. In some embodiments, after filling the second trenches 111 with these layers, a chemical mechanical polishing may be carried out to planarize the surface of the structure.

Figure 15A:
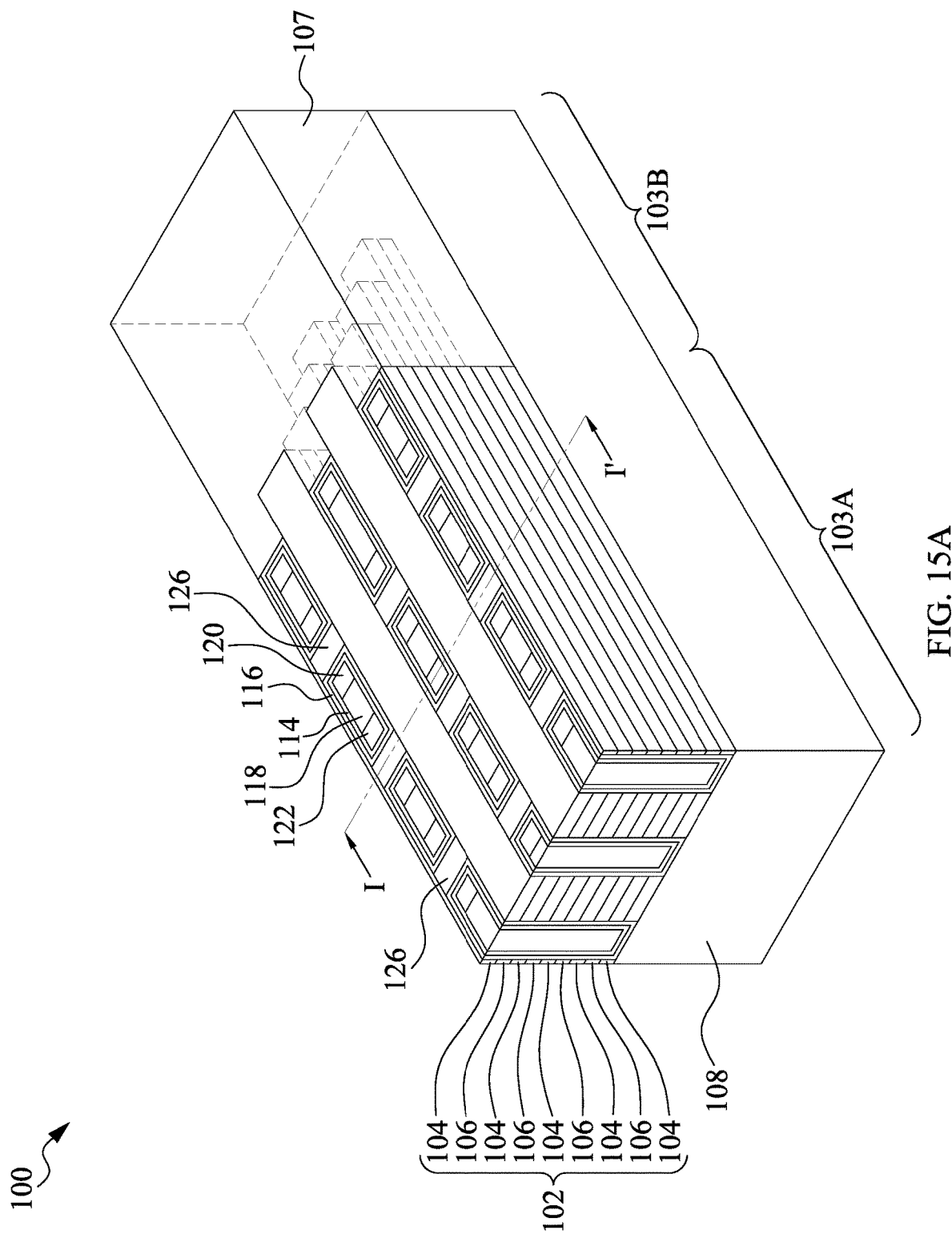
Figure 15B:
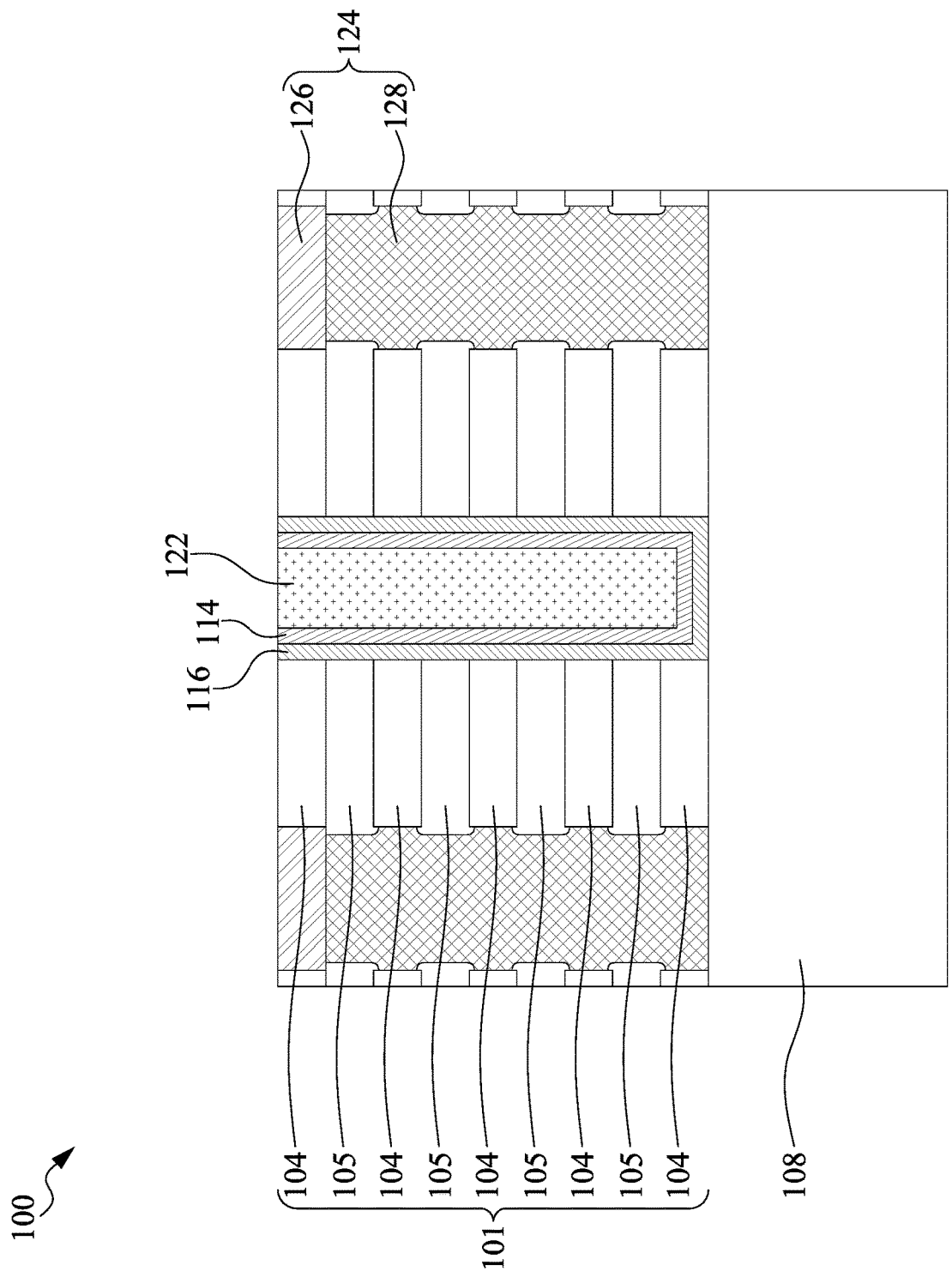

As shown in FIGS. 15A and 15B, the method further comprises the steps of removing a portion of the third material 115 to form a plurality of third trenches (not shown) and a plurality of fourth trenches (not shown) apart from the third trenches, and depositing a second conductive material in the third trenches to form bit lines and depositing a third conductive material in the fourth trenches to form source lines. In some embodiments, the third and fourth trenches may include square shaped grooves, rectangular shaped grooves, round shaped grooves, oval shaped grooves or the like. In some embodiments, the second conductive material and the third conductive material may independently include various conductive materials, e.g., metal such as aluminum (Al), titanium (Ti), cobalt (Co), silver (Ag), gold (Au), copper (Cu), nickel (Ni), chromium (Cr), hafnium (Hf), rhodium (Ru), tungsten (W), platinum (Pt) and/or alloys thereof, or a metal nitride such as titanium nitride (TiN), tantalum nitride (TaN), or the like, but is not limited thereto. In some embodiments, chemical vapor deposition (CVD) or atomic layer deposition (ALD) may be used to deposit the second and third conductive materials.

Figure 16:
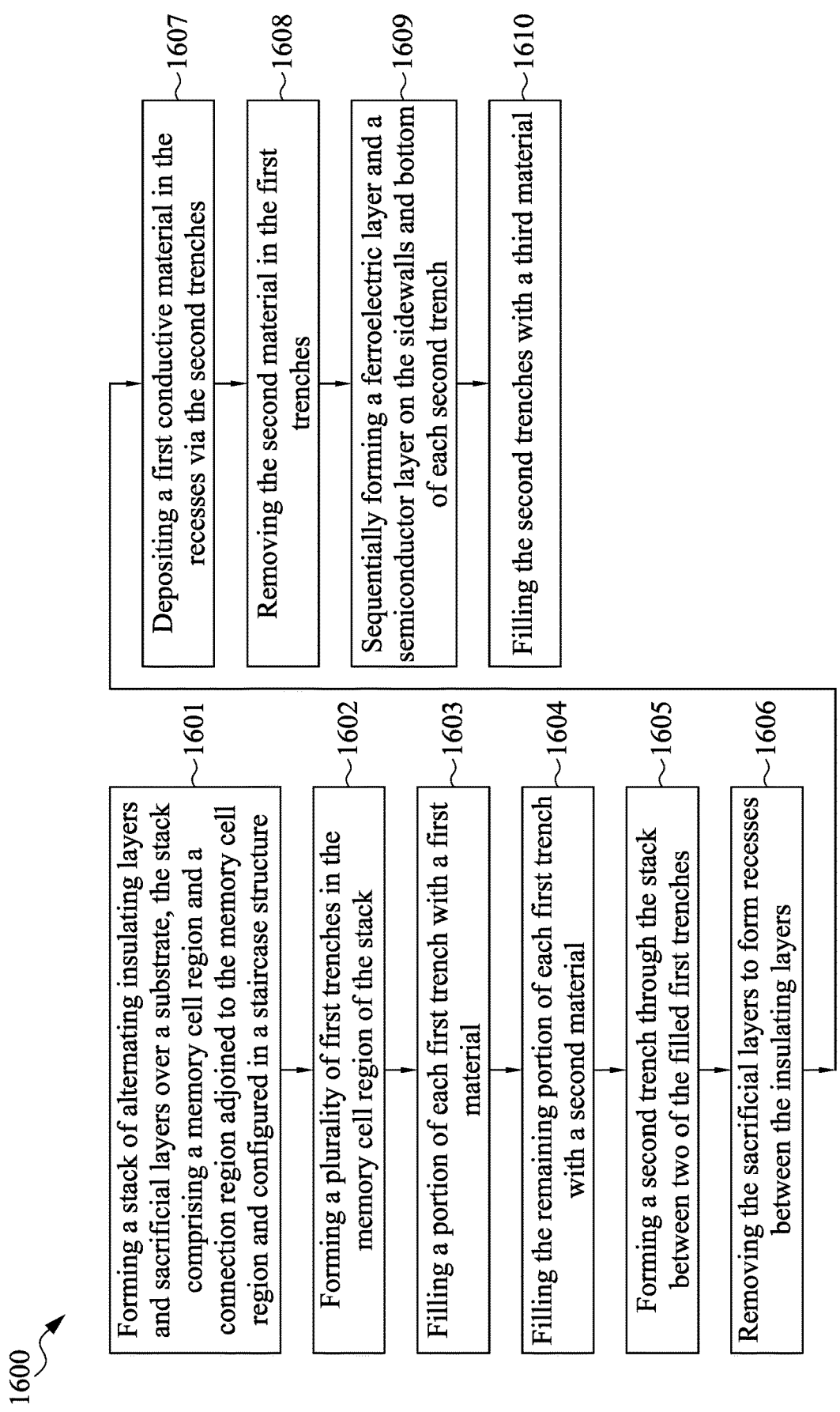
FIG. 16 is a flow diagram of a method of manufacturing a semiconductor memory device in accordance with some embodiments of the present disclosure.

In some embodiments, another method of manufacturing a semiconductor memory device is also disclosed. FIG. 16 is a flowchart of an embodiment of the method 1600 of manufacturing the semiconductor memory device. The method 1600 includes a number of operations (1601, 1602, 1603, 1604, 1605, 1606, 1607, 1608, 1609 and 1610) and the description and illustration are not deemed as a limitation as the sequence of the operations and the structure of the semiconductor memory device.

In some embodiments, the method 1600 of manufacturing a semiconductor memory device includes the steps of forming a stack of alternating insulating layers and sacrificial layers over a substrate, the stack comprising a memory cell region and a connection region adjoined to the memory cell region and configured in a staircase structure 1601; forming a plurality of first trenches in the memory cell region of the stack 1602; filling a portion of each first trench with a first material 1603; filling the remaining portion of each first trench with a second material 1604; forming a second trench through the stack between two of the filled first trenches 1605; removing the sacrificial layers to form recesses between the insulating layers 1606; depositing a first conductive material in the recesses via the second trenches 1607; removing the second material in the first trenches 1608; sequentially forming a ferroelectric layer and a semiconductor layer on the sidewalls and bottom of each second trench 1609; and filling the second trenches with a third material 1610. In some embodiments, operations 701 to 709 correspond to operations 1601 to 1607, 1608 and 1609, so that similar descriptions are omitted. In some embodiments, operations 701 to 709 correspond to operations 1601 to 1607, 1609 and 1610, and the repetition of similar descriptions are omitted.

FIGS. 17A, 18A, 19A, 20A, and 21A are schematic views of manufacturing a semiconductor memory device 200 by the method of FIG. 16 in accordance with some embodiments of the present disclosure. FIGS. 17B, 18B, 19B, 20B, and 21B are schematic cross-sectional views taken along line I-I' of FIGS. 17A, 18A, 19A, 20A, and 21A. In some embodiments, FIGS. 17A to 20A and 17B to 20B correspond or are similar to FIGS. 10A to 13A and 10B and 13B, and in these figures, like reference numerals will be given to like portions to those which have already been described above so as to omit the repetition of similar descriptions. In addition, portions about which no particular description will be made have the similar constructions to those of the semiconductor memory structure 100 described above and provide the same advantages provided thereby.

Figure 17A:
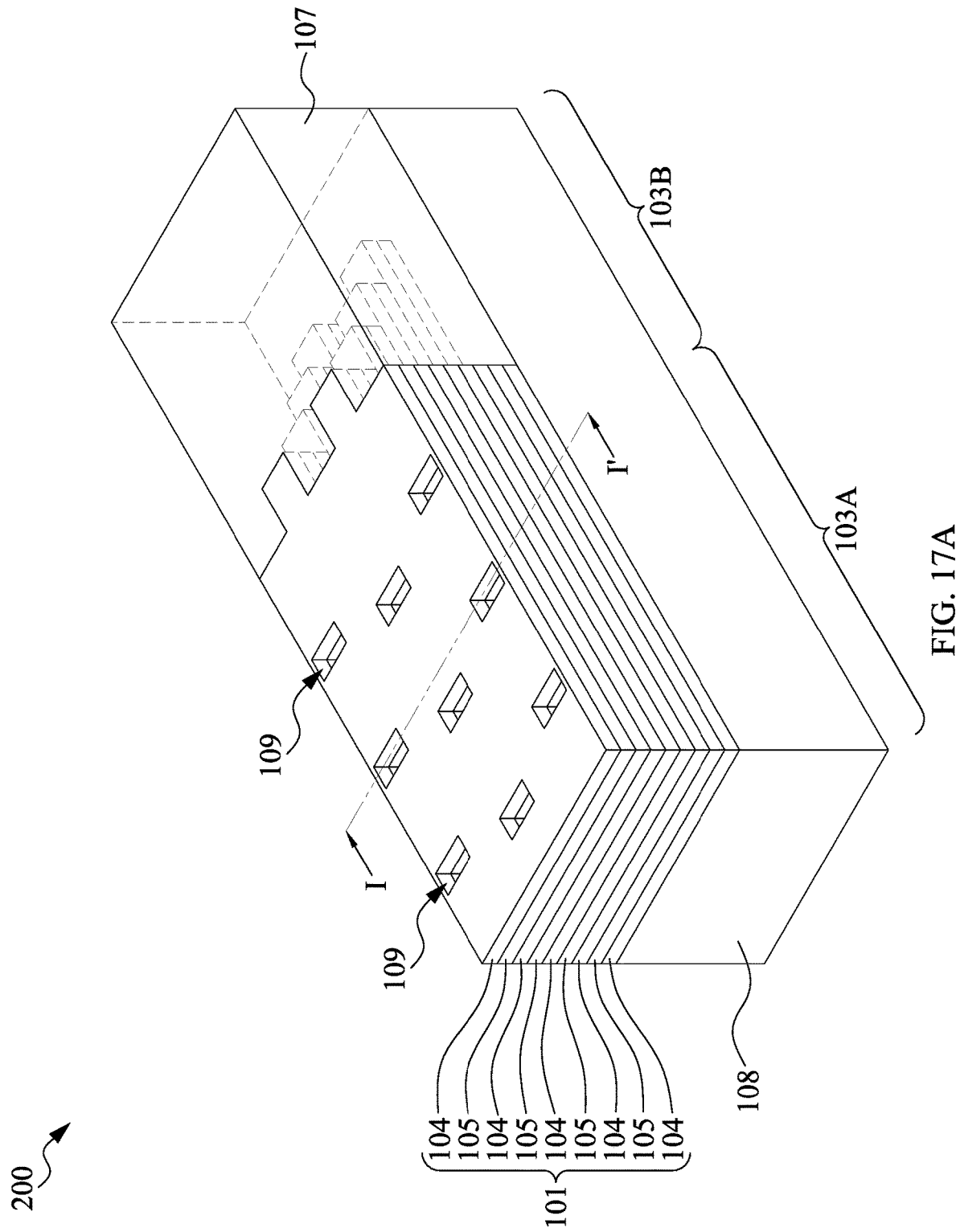
FIGS. 17A, 18A, 19A, 20A, and 21A are schematic views of manufacturing a semiconductor memory device 100 in accordance with some embodiments of the present disclosure.
Figure 18A:
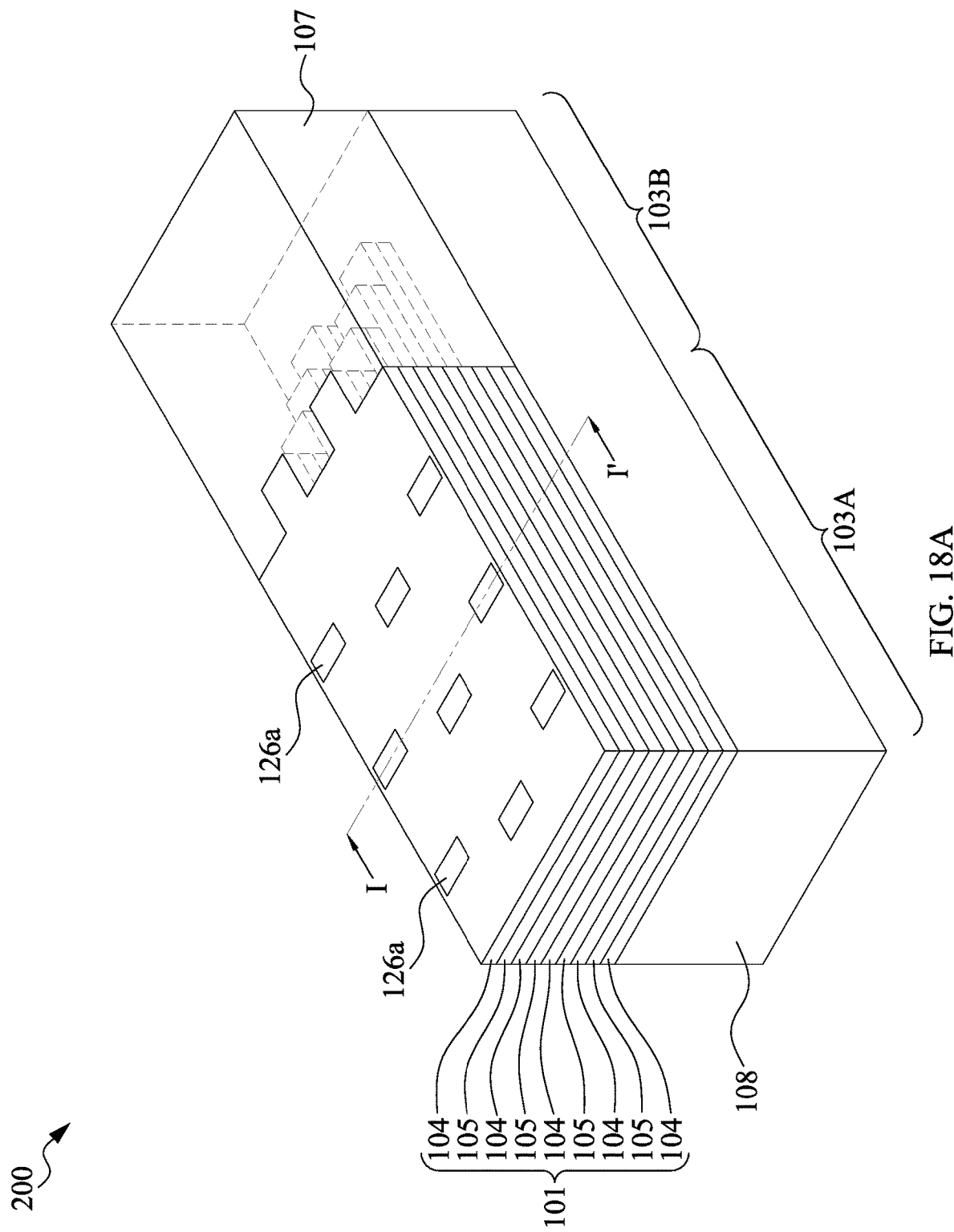
Figure 18B:
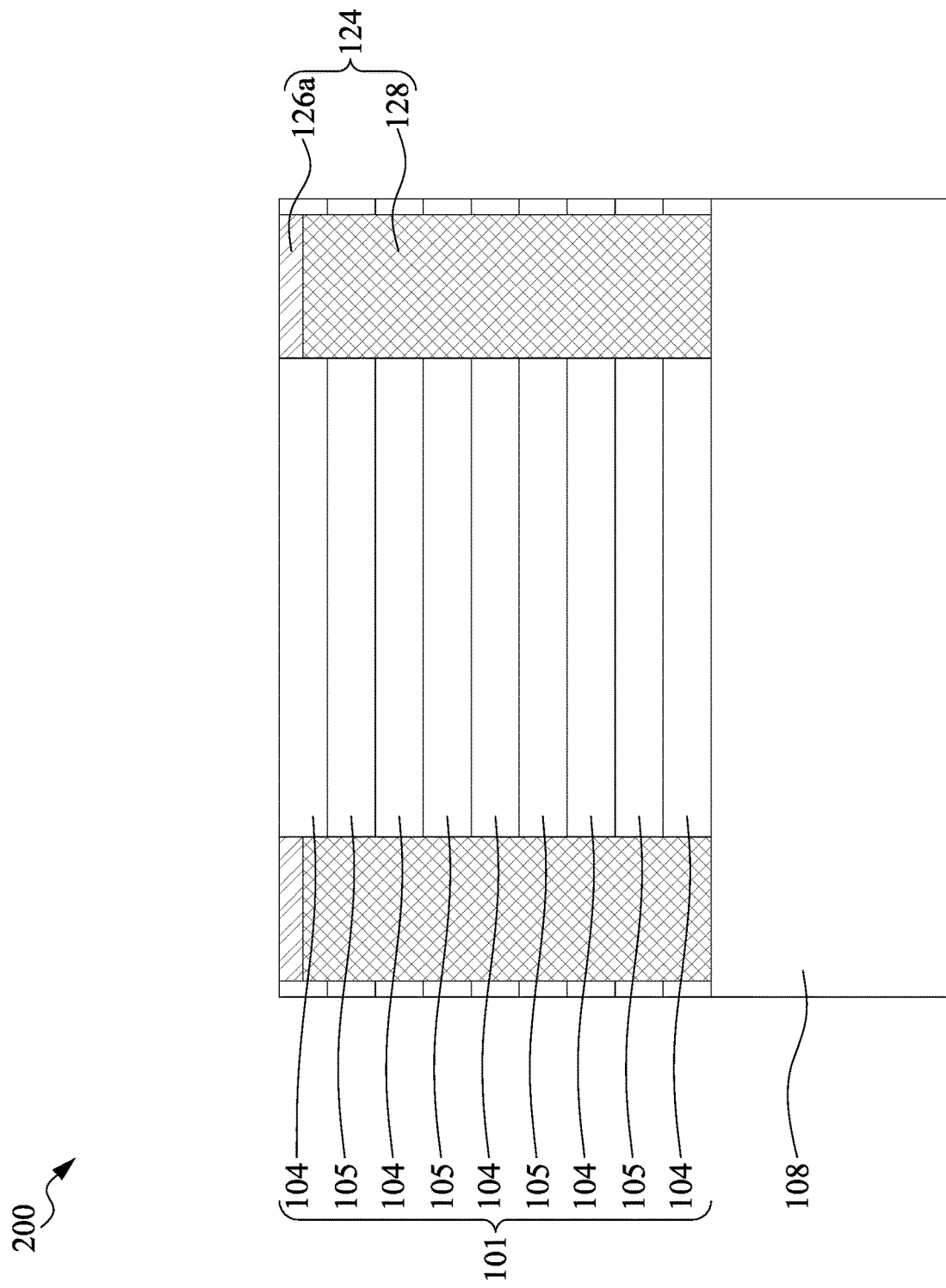

As shown in FIGS. 17A and 17B, a plurality of first trenches 109 are formed in the stack 101 of alternating insulating layers 104 and first conductive layers 106. As shown in FIGS. 18A and 18B, a portion of each of the first trenches 109 is filled with the first material to form the bottom portion 128, and the remaining portion of each first trench 109 is filled with a second material to form the top portion 126a. In some embodiments, the second material includes metal, such as aluminum (Al), titanium (Ti), cobalt (Co), silver (Ag), gold (Au), copper (Cu), nickel (Ni), chromium (Cr), hafnium (Hf), rhodium (Ru), tungsten (W), platinum (Pt) and/or alloys thereof, but is not limited thereto. In some embodiments, the top portion 126a is a thin metal layer. In some embodiments, the metal top portion 126a has a thickness of about . . . to about. In some embodiments, a thickness of the metal top portion 126a is less than a thickness of the bottom portion 128. In some embodiments, a thickness of the metal top portion 126a is less than a thickness of the insulating layers 104. In some embodiments, a thickness of the metal top portion 126a is less than a thickness of the uppermost insulating layer 104. In some embodiments, the thickness of the metal top portion 126a and the total thickness of the metal top portion 126a and the bottom portions 128 (i.e., the cell isolation structures 124) are in a ratio ranging from about 1:80 to about 1:100, about 1:85 to about 1:100, about 1:90 to about 1:100, or about 1:95 to about 1:100. In some embodiments, a top surface of the metal top portions 126a can be aligned with a top surface of the uppermost insulating layers 104, such that the height of the cell isolation structures 124 will not be affected even the metal top portions 126, and a flat surface can be obtained as shown in FIG. 18B. In some embodiments, the metal top portions 126a may be removed at a later stage, e.g., after forming the first conductive material 113, or prior to forming the ferroelectric layer 116 (see FIGS. 21A and 21B).

Figure 19A:
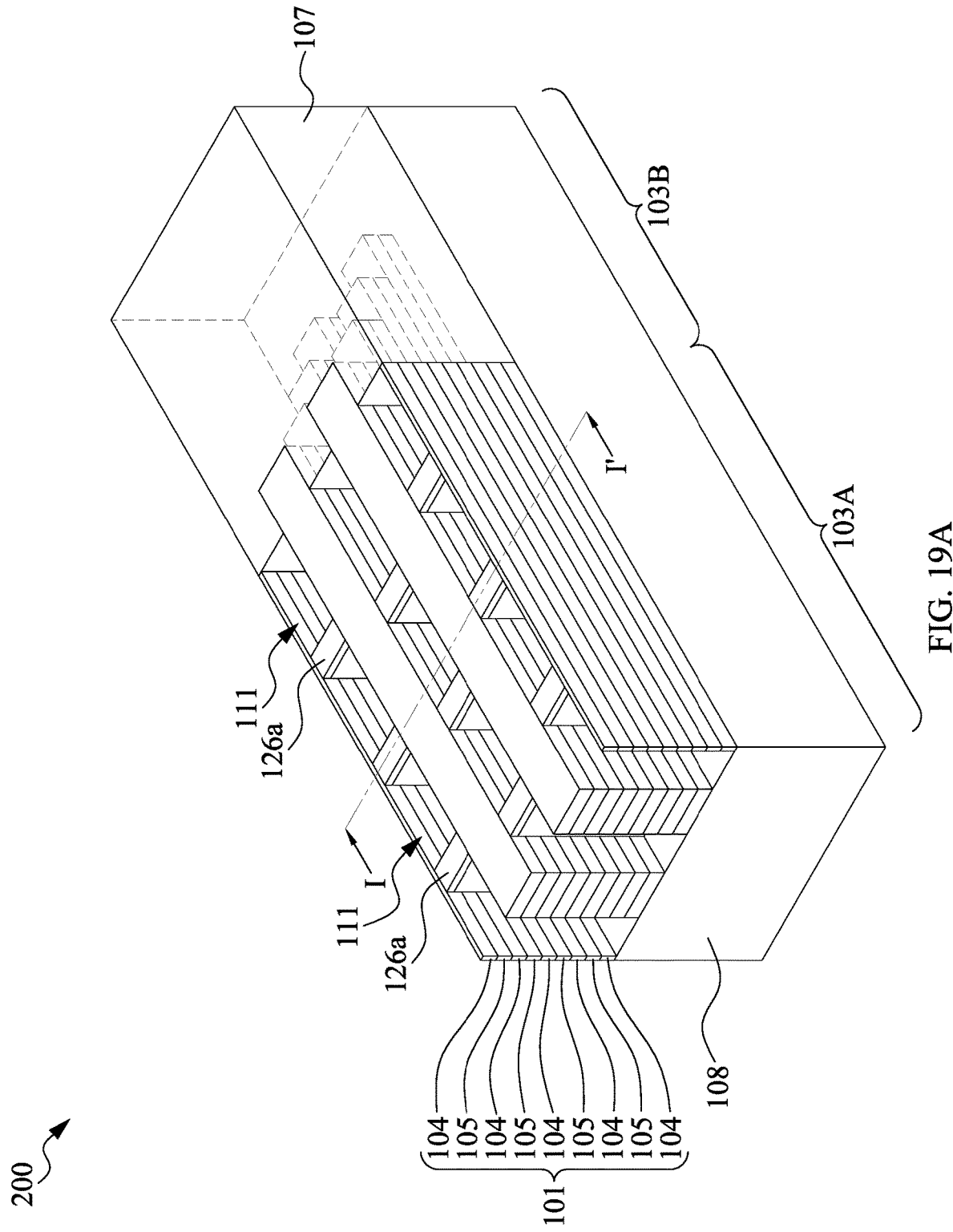
Figure 19B:
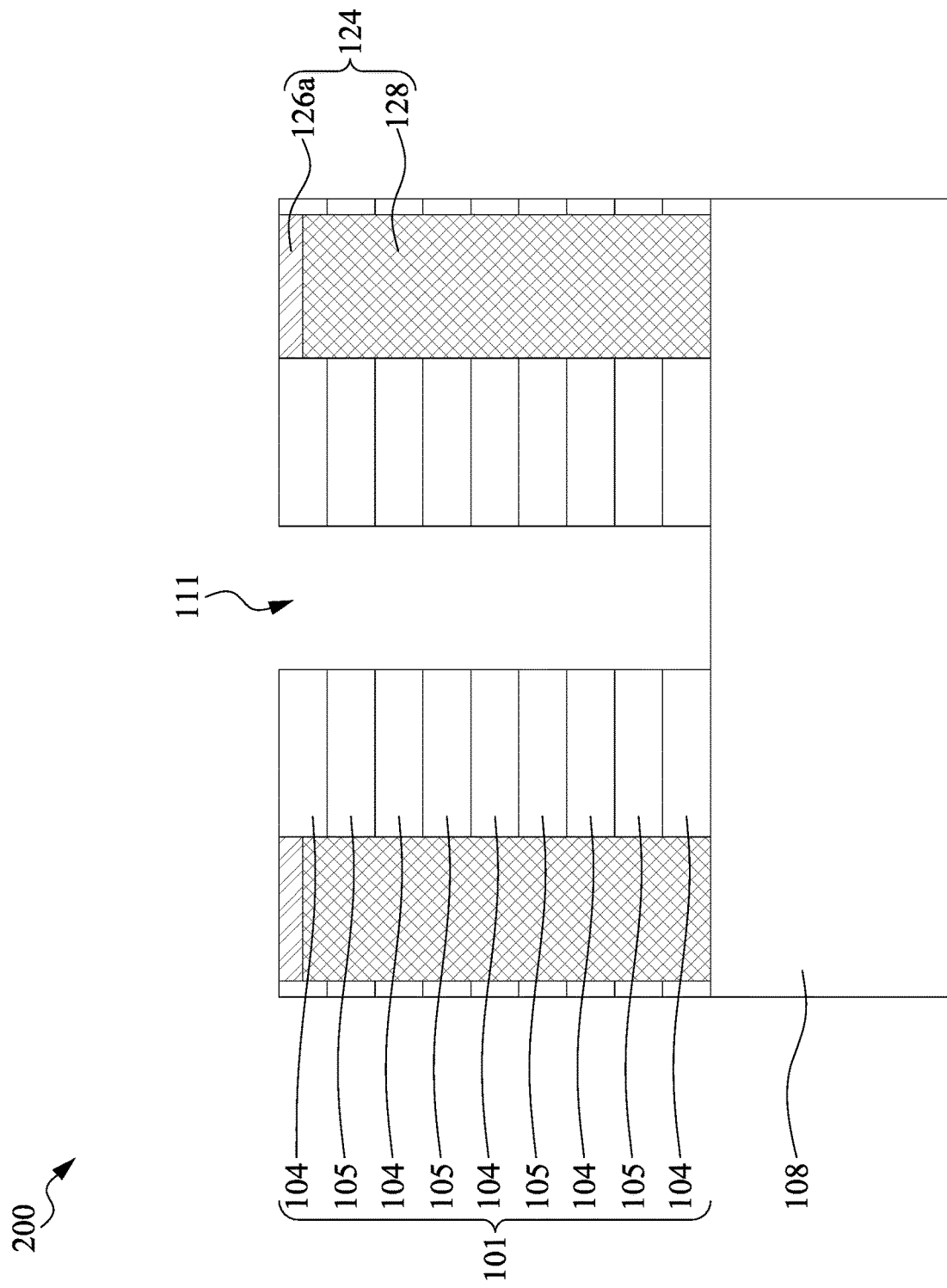
Figure 20A:
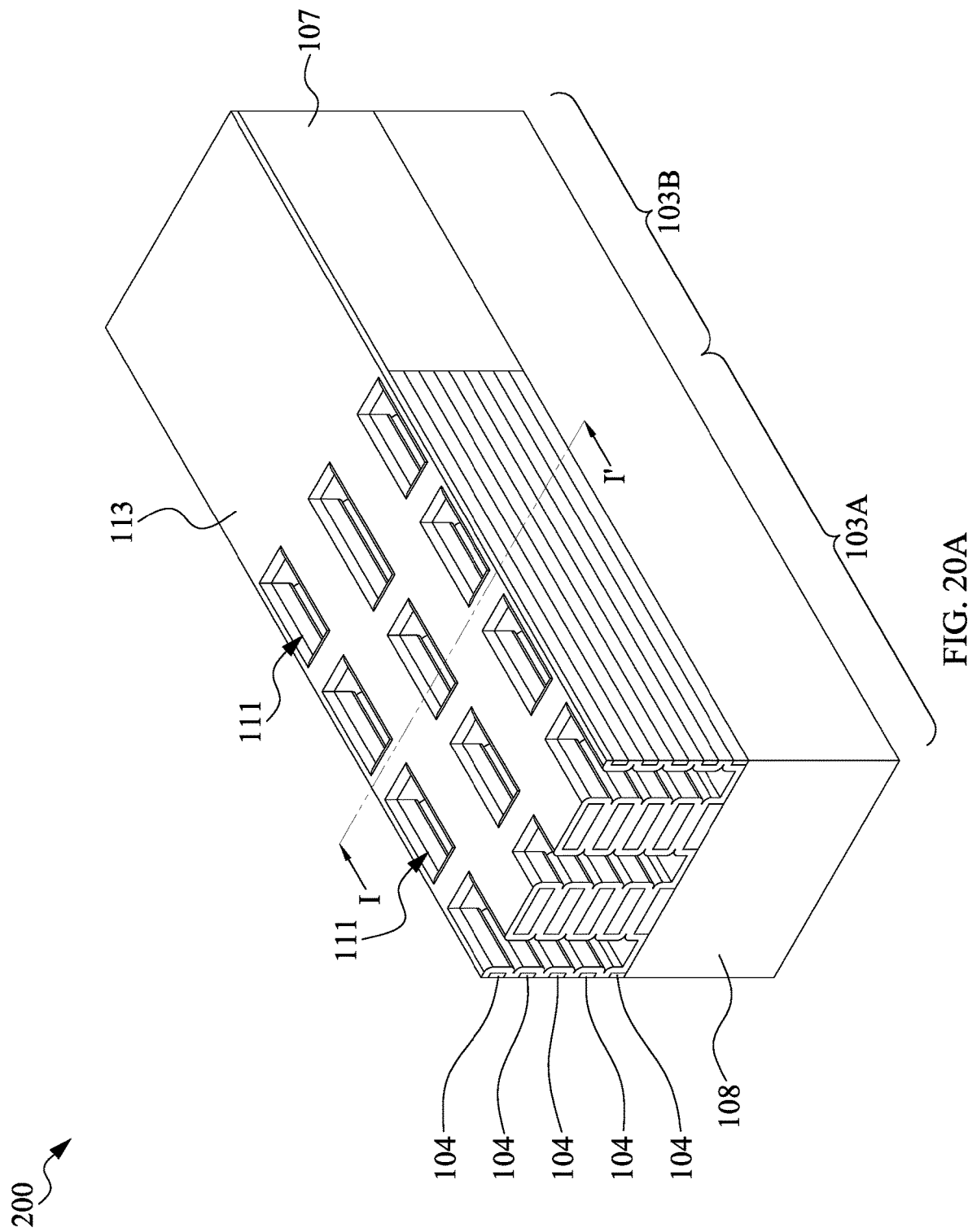
Figure 20B:
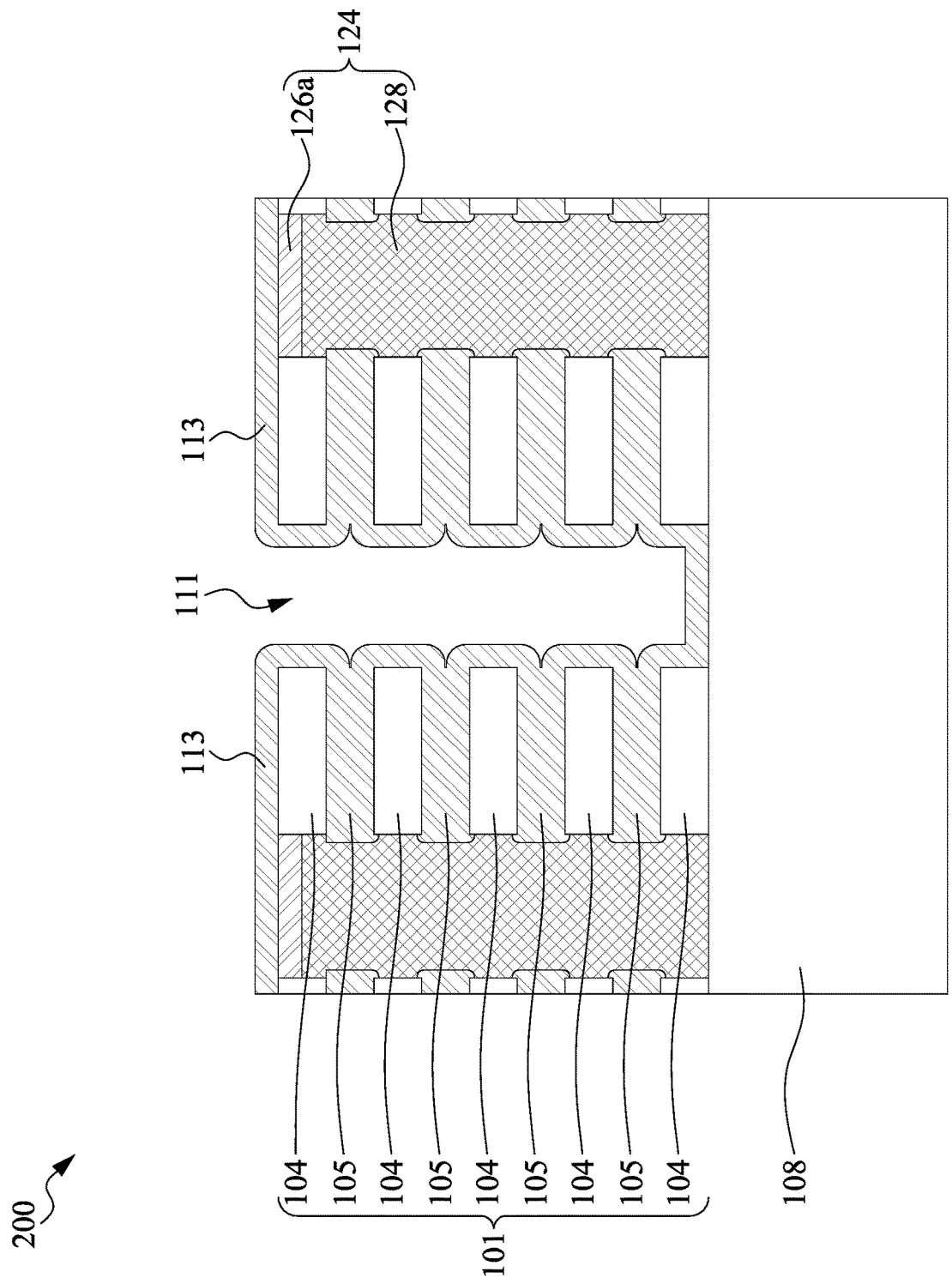

As shown in FIGS. 19A and 19B, the second trench 111 is formed through the stack 101 between two of the cell isolation structures 124 to expose a portion of the substrate 108. As shown in FIGS. 20A and 20B, the sacrificial layers 105 are removed to form recesses (not shown) between the insulating layers 104, and the first conductive material 113 is deposited in the recesses via the second trenches 111. In some embodiments, the first conductive material 113 covers the metal top portions 126a, the surface of the uppermost insulating layer 104, the sidewalls of the second trenches 111, the recesses and the laterally-etched cavities of the bottom portions 128, and is deposited over the exposed substrate 108.

Figure 21A:
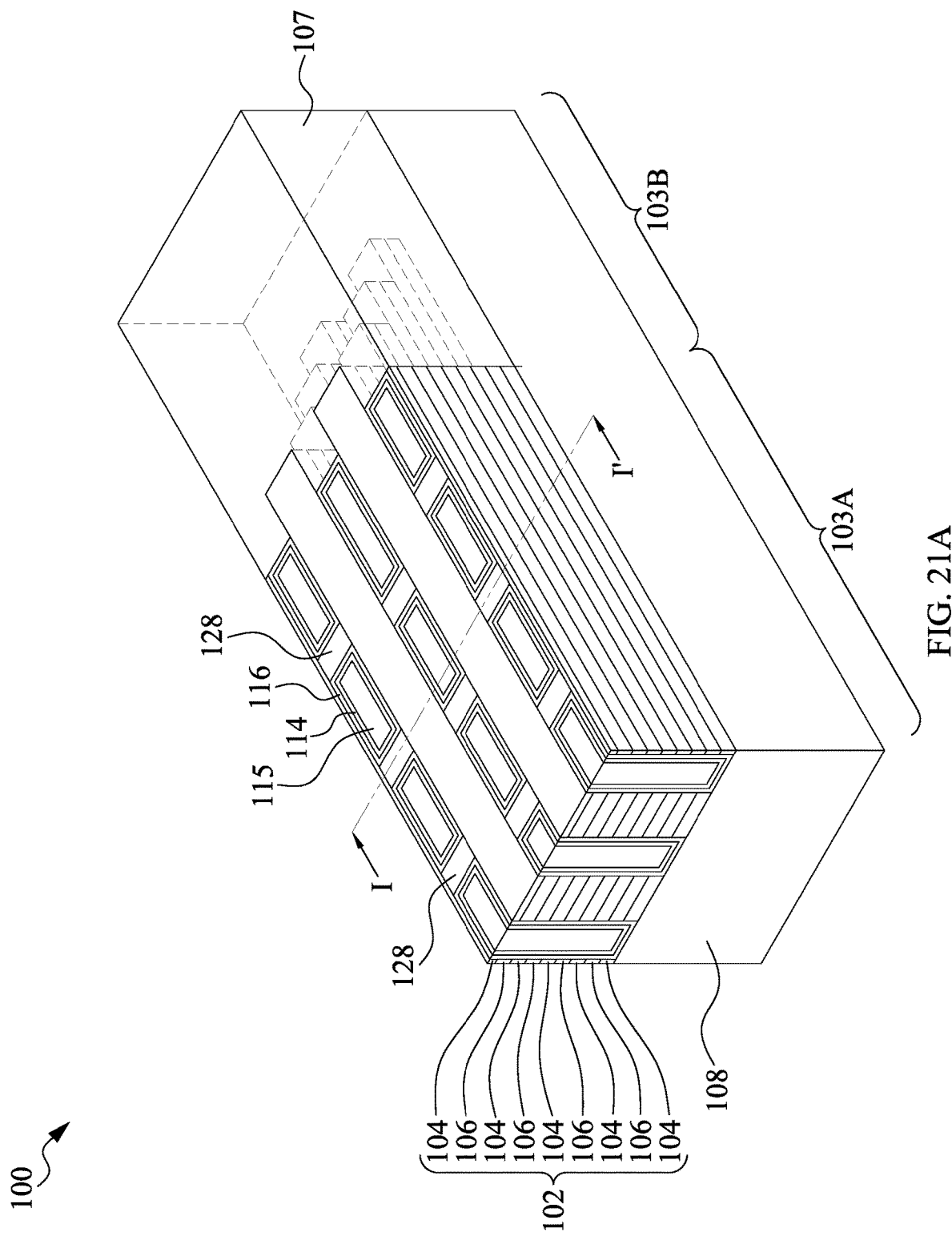
Figure 21B:
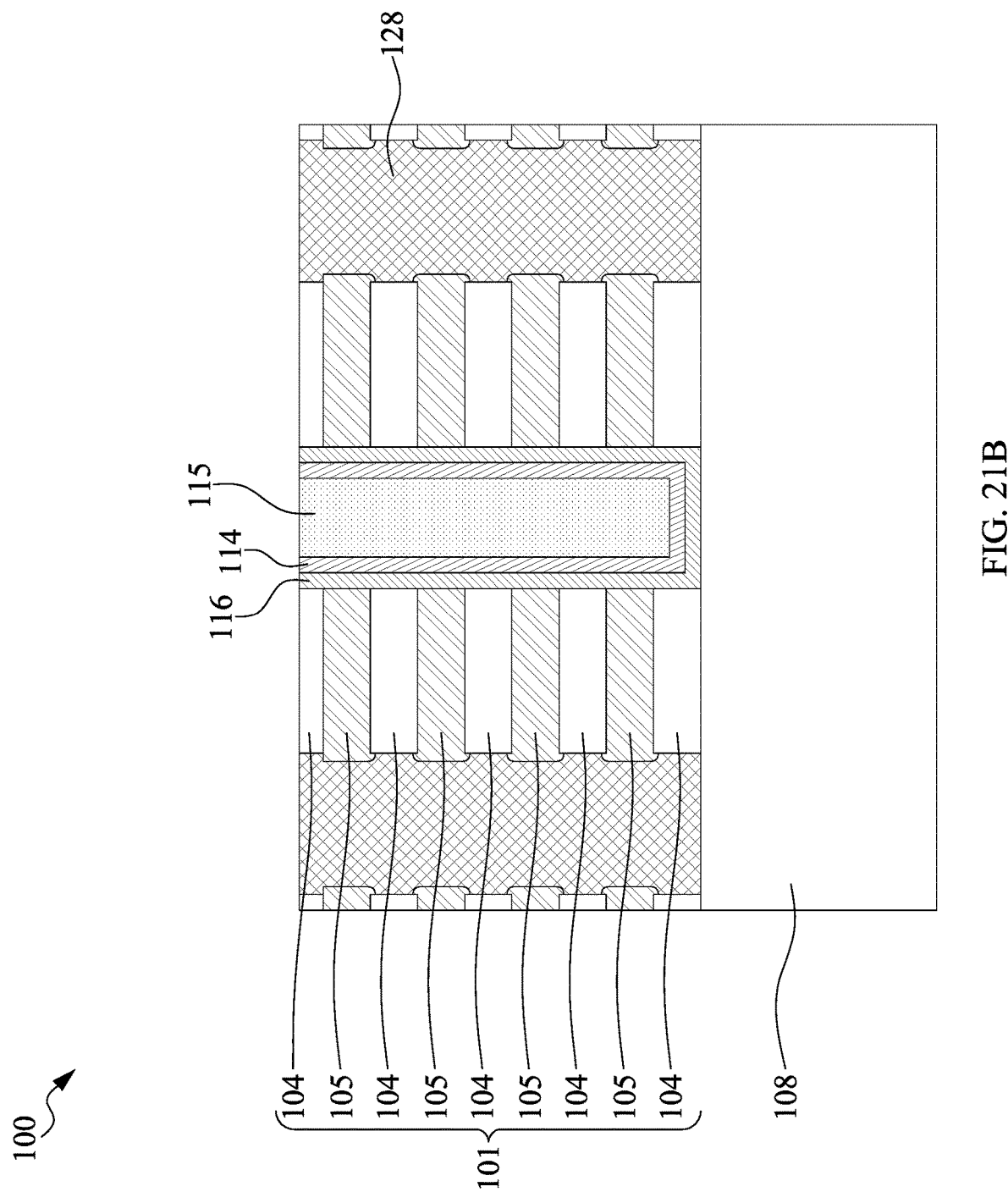

In some embodiments, the metal top portions 126a may be removed, e.g., after forming the first conductive material 113, or prior to forming the ferroelectric layer 116 (see FIG. 21B). As shown in FIGS. 21A and 21B, the metal top portions 126a and the excessive conductive material 113 comprising the conductive materials outside the recesses, on the sidewalls of the second trenches 111 (see FIG. 19B), at the bottom of the second trenches 111 and on the surface of the uppermost insulating layers 104, are removed, e.g., by etching. In some embodiments, after the etching, the bottom surfaces of the second trenches 111, the sidewalls of the insulating layers 104, and the surface of the uppermost insulating layers 104 are exposed. In some embodiments, the excessive conductive materials 113 outside the recesses are removed to form vertical memory holes (not shown) in the alternating conductive layers (word lines) (e.g., 106 as shown in FIG. 1) and the insulating layers 104. Thereafter, the ferroelectric layer 116 and the semiconductor layer 114 are sequentially formed on the sidewalls and bottoms of the second trenches 111 (see FIG. 19B), and the second trenches 111 are then filled with the third material 115. Likewise, the method may further includes the steps of removing a portion of the third isolation material 115 to form a plurality of third trenches (not shown) and a plurality of fourth trenches (not shown) apart from the third trenches, and depositing a second conductive layer in the third trenches to form bit lines and depositing a third conductive layer in the fourth trenches.

In the present disclosure, a 3D stackable FeRAM nonvolatile memory device is provided, which uses a hard head on strut/cell isolation for protection during the word line etching process, so as to reduce height loss of strut/cell isolation. The hard head and corresponding manufacturing process help improve structural stability and reliability of FeRAM devices. A design of the 3D stackable semiconductor memory device is modified so that the loss of height/thickness of the strut/cell isolation can be prevented. Accordingly, a stable type of 3D stackable nonvolatile memory devices can be formed, so that the device property can be enhanced.

In some embodiments, a method of manufacturing a semiconductor memory device, the method comprises forming a stack of alternating insulating layers and sacrificial layers over a substrate, the stack comprising a memory cell region and a connection region adjoined to the memory cell region and configured in a staircase structure; forming a plurality of first trenches in the memory cell region of the stack; filling a portion of each first trench with a first material; filling the remaining portion of each first trench with a second material; forming a second trench through the stack between two of the filled first trenches; removing the sacrificial layers to form recesses between the insulating layers; depositing a first conductive material in the recesses via the second trenches; sequentially forming a ferroelectric layer and a semiconductor layer on the sidewalls and bottom of each second trench; and filling the second trenches with a third material.

In some embodiments, a semiconductor memory device comprises a stack of alternating insulating layers and first conductive layers disposed over a substrate; a plurality of memory cell strings penetrating the stack over the substrate; and a plurality of cell isolation structures penetrating the stack over the substrate and disposed between two memory cell strings, wherein each cell isolation structure comprises a top portion and a bottom portion adjoined to the top portion and different from the top portion.

In some embodiments, a semiconductor memory device comprises a stack of alternating insulating layers and first conductive layers over a substrate, the stack comprising a memory cell region and a connection region adjoined to the memory cell region and configured in a staircase structure; a plurality of memory cell strings penetrating the stack over the substrate; and a plurality of cell isolation structures penetrating the stack over the substrate and disposed between two memory cell strings, wherein each cell isolation structure comprises a top portion and a bottom portion adjoined to the top portion and different from the top portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a semiconductor memory device, the method comprising:
    forming a stack of alternating insulating layers and sacrificial layers over a substrate, the stack comprising a memory cell region and a connection region adjoined to the memory cell region and configured in a staircase structure;
    forming a plurality of first trenches in the memory cell region of the stack;
    filling a portion of each first trench with a first material;
    filling the remaining portion of each first trench with a second material;

forming a second trench through the stack between two of the filled first trenches;

removing the sacrificial layers to form recesses between the insulating layers;

depositing a first conductive material in the recesses via the second trenches;

sequentially forming a ferroelectric layer and a semiconductor layer on the sidewalls and bottom of each second trench; and filling the second trenches with a third material.

2. The method of claim 1, further comprising:

removing a portion of the third material to form a plurality of third trenches and a plurality of fourth trenches apart from the third trenches; and depositing a second conductive material in the third trenches and depositing a third conductive material in the fourth trenches.

3. The method of claim 1, wherein the first material comprises a first isolation dielectric, and the second material comprises a second isolation dielectric different from the first isolation dielectric.

4. The method of claim 1, wherein the first material comprises an isolation dielectric, and the second material comprises metal.

5. The method of claim 4, further comprising removing the second material after forming the first conductive material or prior to forming the ferroelectric layer.

6. The method of claim 1, wherein the first material has an etch selectivity ratio different from the second material.

7. The method of claim 1, wherein the second material has an etch selectivity ratio different from the insulating layers of the stack.

8. The method of claim 1, wherein the second material has a hardness higher than the insulating layers of the stack.

9. A semiconductor memory device, comprising:

a stack of alternating insulating layers and first conductive layers disposed over a substrate;

a plurality of memory cell strings penetrating the stack over the substrate; and a plurality of cell isolation structures penetrating the stack over the substrate and disposed between two memory cell strings, wherein each cell isolation structure comprises a top portion and a bottom portion adjoined to the top portion and different from the top portion.

10. The semiconductor memory device of claim 9, wherein the plurality of memory cell strings are arranged in an array configuration of rows and columns or in a staggered array configuration.

11. The semiconductor memory device of claim 9, wherein the top portions of the cell isolation structures have an etch selectivity ratio different from the bottom portions of the cell isolation structures.

12. The semiconductor memory device of claim 9, wherein the top portions of the cell isolation structures have an etch selectivity ratio different from the insulating layers of the stack.

13. The semiconductor memory device of claim 9, wherein the top portions of the cell isolation structures have a hardness higher than the bottom portions of the cell isolation structures.

14. The semiconductor memory device of claim 9, wherein the top portions of the cell isolation structures have a hardness higher than the insulating layers of the stack.

15. The semiconductor memory device of claim 9, wherein top surfaces of the cell isolation structures are coplanar to a top surface of the stack.

16. A semiconductor memory device, comprising:

a stack of alternating insulating layers and first conductive layers over a substrate, the stack comprising a memory cell region and a connection region adjoined to the memory cell region and configured in a staircase structure;

a plurality of memory cell strings penetrating the stack over the substrate; and a plurality of cell isolation structures penetrating the stack over the substrate and disposed between two memory cell strings, wherein each cell isolation structure comprises a top portion and a bottom portion adjoined to the top portion and different from the top portion.

17. The semiconductor memory device of claim 16, wherein each memory cell string comprises a central portion extending through the stack, a semiconductor layer surrounding the central portion, and a ferroelectric layer surrounding the semiconductor layer.

18. The semiconductor memory device of claim 16, wherein the plurality of memory cell strings are arranged in an array configuration of rows and columns or in a staggered array configuration.

19. The semiconductor memory device of claim 16, wherein a thickness of the top portion is less than, similar to, or higher than a thickness of the bottom portion.

20. The semiconductor memory device of claim 16, wherein top surfaces of the cell isolation structures are coplanar to a top surface of the stack.

* * * * *